United States Patent
Kang et al.

(10) Patent No.: US 7,163,890 B2
(45) Date of Patent: Jan. 16, 2007

(54) METHODS OF FABRICATING SEMICONDUCTOR DEVICE HAVING SLOPE AT LOWER SIDES OF INTERCONNECTION HOLE WITH ETCH-STOP LAYER

(75) Inventors: Ki-Ho Kang, Hwaseong-si (KR);
Hyeok-Sang Oh, Suwon-si (KR);
Jung-Woo Lee, Suwon-si (KR);
Dae-Keun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 223 days.

(21) Appl. No.: 10/910,922

(22) Filed: Aug. 4, 2004

(65) Prior Publication Data

US 2005/0054192 A1    Mar. 10, 2005

(30) Foreign Application Priority Data

Sep. 9, 2003    (KR) .................. 10-2003-0063289

(51) Int. Cl.
*H01L 21/4763* (2006.01)
(52) U.S. Cl. .................. 438/638; 438/640; 438/634; 257/E21.577; 257/E21.578
(58) Field of Classification Search ......... 438/637–640
See application file for complete search history.

(56) References Cited

U.S. PATENT DOCUMENTS

| | | | | | |
|---|---|---|---|---|---|
| 4,181,564 | A | * | 1/1980 | Fogarty et al. | 438/701 |
| 4,764,484 | A | * | 8/1988 | Mo | 438/638 |
| 4,816,115 | A | * | 3/1989 | Horner et al. | 438/623 |
| 5,801,094 | A | * | 9/1998 | Yew et al. | 438/624 |
| 5,861,344 | A | * | 1/1999 | Roberts et al. | 438/738 |
| 5,883,002 | A | * | 3/1999 | Shih et al. | 438/640 |
| 5,888,887 | A | * | 3/1999 | Li et al. | 438/525 |
| 6,218,283 | B1 | * | 4/2001 | Park et al. | 438/622 |
| 6,287,959 | B1 | * | 9/2001 | Lyons et al. | 438/636 |
| 6,333,224 | B1 | * | 12/2001 | Lee | 438/243 |
| 6,635,576 | B1 | * | 10/2003 | Liu et al. | 438/700 |
| 6,680,248 | B1 | * | 1/2004 | Huang et al. | 438/638 |
| 7,045,455 | B1 | * | 5/2006 | Zhang et al. | 438/636 |

* cited by examiner

*Primary Examiner*—David A. Zarneke
(74) *Attorney, Agent, or Firm*—F. Chau & Associates, LLC

(57) ABSTRACT

Methods of manufacturing semiconductor devices having slopes at lower sides of an interconnection hole include an etch-stop layer and an interlayer dielectric layer sequentially formed on a semiconductor substrate having the lower conductive layer. Portions of the etch-stop layer are exposed by selectively etching the interlayer dielectric layer. A step is formed in the etch-stop layer by removing portions of the exposed etch-stop layer. And, the step is formed at a boundary between a recessed portion of the exposed etch-stop layer and a raised portion of the etch-stop layer covered with the interlayer dielectric layer. Portions of the interlayer dielectric layer are removed to expose portions of the raised portion of the etch-stop layer. And, the exposed recessed and raised portions are anisotropically etched to expose the lower conductive layer and to form the interconnection hole having the slopes, wherein the slopes are made of a residual etch-stop layer at the lower sides of the interconnection hole.

15 Claims, 23 Drawing Sheets

METHODS OF FABRICATING SEMICONDUCTOR DEVICE HAVING SLOPE AT LOWER SIDES OF INTERCONNECTION HOLE WITH ETCH-STOP LAYER

CROSS-REFERENCE TO RELATED APPLICATION

This application claims priority to Korea Patent Application No. 2003-63289, filed on Sep. 9, 2003, which is incorporated herein by reference in its entirety.

BACKGROUND OF THE INVENTION

1. Field of the Invention

The present invention relates to the field of fabricating a semiconductor device and, more particularly, to methods for fabricating a semiconductor device having slopes at lower sides of an interconnection hole with an etch-stop layer.

2. Description of the Related Art

In general, in high-performance, highly integrated semiconductor devices, upper and lower metal layers are connected using a multi-layered structure. Al (aluminum), which is used as the metal wiring in a conventional process of fabricating the semiconductor device, is not suitable for fabricating the highly integrated semiconductor devices due to problems such as electromigration, low melting point and the like. Thus, a metal such as copper is used instead, which has relatively better electromigration characteristic, lower resistance, and a higher melting point than Al.

The metal wirings of the multi-layered structure are interconnected by a via hole, and it is very important to form a metal layer without a void occurring within the via hole of the highly integrated semiconductor device having a high aspect ratio. The metal layer may be formed by using physical vapor deposition, chemical vapor deposition, or electrochemical deposition and the like. However, in accordance with characteristics of each metal, the method for forming a metal layer is limited. For example, when the physical vapor deposition method is used to form a copper layer, characteristics of step coverage deteriorate. As a result, an overhang is formed at an entrance of the via hole or a contact hole, which is to be filled with the copper layer. When the chemical vapor deposition method is used to form a copper layer, there is the weak point that nonvolatile solid state $CuCl_2$ is generated during the deposition process.

The above-mentioned problems can be overcome by an electrochemical deposition method. The U.S. Pat. No. 5,256,274 to Poris et al discloses a method for forming the copper layer by using the electrochemical deposition method, entitled "Selective Metal Electrodeposition".

Hereinafter, the method for fabricating the conventional metal wirings using the electrochemical deposition method will be described with reference to FIGS. 1A to 1F, FIGS. 2A and 2B, and FIG. 3.

Referring to FIG. 1A, on a semiconductor substrate 10 including a completed lower structure consisting of a device isolation layer 11, a gate electrode 12 and an insulating spacer 13, an etch-stop layer 14 and an interlayer dielectric layer 15, which are consecutively formed.

Referring to FIG. 1B, at least one preliminary via hole 15a for exposing the etch-stop layer 14 within the interlayer dielectric layer 15 is formed by selectively etching the interlayer dielectric layer 15.

Referring to FIG. 1C, a via hole 15b for exposing the gate electrode 12 is formed by removing the exposed etch-stop layer 14 at the bottom surface of the preliminary via hole 15a.

Referring to FIG. 1D, the interlayer dielectric layer 15 including the via hole 15b and the exposed gate electrode 12 are covered with a seed layer 16 by a physical vapor deposition method. The seed layer 16 is connected to an electrode in a subsequent electrochemical deposition process. A metal diffusion barrier layer may be formed before forming the seed layer 16.

As can be seen from the FIG. 1E, by forming a metal layer 17 such as copper layer on the seed layer 16 by the electrochemical deposition method, the via hole 15b is filled with the metal layer 17.

Next, as can be seen from the FIG. 1F, a CMP (chemical mechanical polishing) process allows the seed layer 16 and the metal layer 17 to remain behind within the via hole 15b so that a seed layer pattern 16a and a metal layer pattern 17a are formed.

FIGS. 2A and 2B show partially enlarged views of the 'A' portion of FIG. 1D, and in particular show cases when the etch-stop layer 14 is removed by performing anisotropic etching and wet etching, respectively.

As can be seen from the FIG. 2A, when the etch-stop layer 14 is removed by the anisotropic etching process, the bottom surface of the via hole 15b has a vertical profile 30. As can be seen from the FIG. 2B, when the etch-stop layer 14 is removed by the wet etching process, the bottom surface of the via hole 15b may have an undercut profile 40. As such, step coverage of the seed layer 16 formed by the physical vapor deposition method is poor in both cases.

FIG. 3 shows a partially enlarged view of the 'A' portion of FIG. 1E, and in particular shows the case when the metal layer 17 is formed on the seed layer 16 with poor step coverage by the electrochemical deposition method. The via hole 15b is not completely filled with the metal layer 17, thereby a void 50 forms in a lower portion of the via hole 15b due to the poor step coverage of the seed layer 16. In addition, when the step coverage of the seed layer 16 is poor, the metal layer 17 formed by the electrochemical deposition method delaminates or comes off the bottom surface of the via hole. Furthermore, when the void 50 is generated, a residue of an electrolyte remains within the void 50. Thus, corrosion of the metal layer 17 due to the residual electrolyte may occur, or explosion of the metal layer 17 may occur due to a gas resulting from the liquid electrolyte during a subsequent thermal process.

SUMMARY OF THE INVENTION

In general, exemplary embodiments of the present invention include methods for fabricating a semiconductor device having a slope at lower sides of an interconnection hole with an etch-stop layer.

According to an exemplary embodiment of the present invention, a method for fabricating a semiconductor device comprises sequentially forming an etch-stop layer and an interlayer dielectric layer on a semiconductor substrate having a lower conductive layer. The interlayer dielectric layer is selectively etched to expose portions of the etch-stop layer. The portions of the exposed etch-stop layer are removed to form a step in the etch-stop layer. The step is formed at a boundary between a recessed portion of the exposed etch-stop layer and raised portion of the etch-stop layer covered with the interlayer dielectric layer. Portions of the interlayer dielectric layer are removed to expose portions of the raised portion. By anisotropically etching the exposed recessed and raised portions, the lower conductive layer is exposed and an interconnection hole having slopes is formed, wherein the slopes comprise a residual etch-stop layer at lower sides of the interconnection hole.

According to another exemplary embodiment of the present invention, a method for fabricating a semiconductor device comprises sequentially forming an etch-stop layer and an inter-metal dielectric layer on a semiconductor substrate where lower metal wiring is formed. The inter-metal dielectric layer is selectively etched to form a first preliminary via hole for exposing portions of the etch-stop layer. The portions of the exposed etch-stop layer are removed to form a step in the etch-stop layer. The step is formed at a boundary between a recessed portion exposed at a bottom surface of the first preliminary via hole and a raised portion covered with the inter-metal dielectric layer. Portions of the inter-metal dielectric layer are removed to form a second preliminary via hole, which exposes portions of the recessed and raised portions and expands the first preliminary via hole. The second preliminary via hole comprises an upper region and a lower region. A sacrificial layer is formed within the second preliminary via hole. The inter-metal dielectric layer is selectively etched to form a trench, which expands the upper region of the second preliminary via hole and connects to the lower region of the second preliminary via hole. The sacrificial layer is removed to again expose portions of the raised portion and the recessed portion at a bottom surface of the lower region of the second preliminary via hole. The exposed recessed and raised portions are anisotropically etched to form a via hole for exposing the lower metal wiring and to form slopes comprising a residual etch-stop layer at lower sides of the via hole. A seed layer is formed for covering the exposed lower metal wiring and the inter-metal dielectric layer having the via hole. A metal layer is formed on the seed layer by electrochemical deposition. The metal layer and the seed layer are patterned.

According to still another exemplary embodiment of the present invention, a method for fabricating a semiconductor device comprises sequentially forming an etch-stop layer and an inter-metal dielectric layer on a semiconductor substrate where lower metal wiring is formed. The inter-metal dielectric layer is selectively etched to form a first preliminary via hole for exposing portions of the etch-stop layer. The first preliminary via hole comprises an upper region and a lower region. Portions of the exposed etch-stop layer are removed to form a step in the etch-stop layer. The step is formed at a boundary between a recessed portion exposed at a bottom surface of the first preliminary via hole and a raised portion covered with the inter-metal dielectric layer. A sacrificial layer is formed within the first preliminary via hole. The inter-metal dielectric layer is selectively etched to form a trench, which expands the upper region of the first preliminary via hole and connects to the lower region of the first preliminary via hole. The sacrificial layer is removed to expose the recessed portion at the bottom surface of the first preliminary via hole. Portions of the inter-metal dielectric layer are removed to form a second preliminary via hole, which exposes portions of the raised and recessed portions and expands the lower region of the first preliminary via hole. The exposed recessed and raised portions are anisotropically etched to form a via hole for exposing the lower metal wiring and to form slopes comprising a residual etch-stop layer at lower sides of the via hole. A seed layer is formed for covering the exposed lower metal wiring and the inter-metal dielectric layer having the via hole. A metal layer is formed on the seed layer by using electrochemical deposition. And, the metal layer and the seed layer are patterned.

These and other exemplary embodiments, features and advantages of the present invention will become more apparent to those of ordinary skill in the art by describing in detail exemplary embodiments thereof with reference to the attached drawings.

DETAILED DESCRIPTION OF THE EXEMPLARY EMBODIMENTS

Figure 1A:
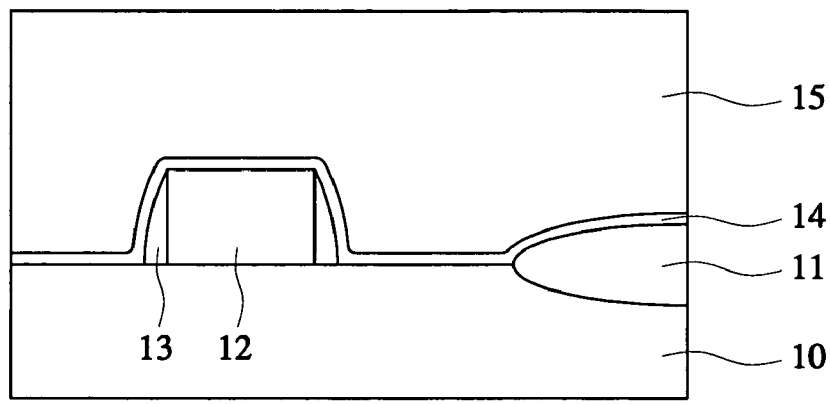
FIGS. 1A to 1F show cross-sectional views of a conventional process of forming metal wiring of a semiconductor device.
Figure 1B:
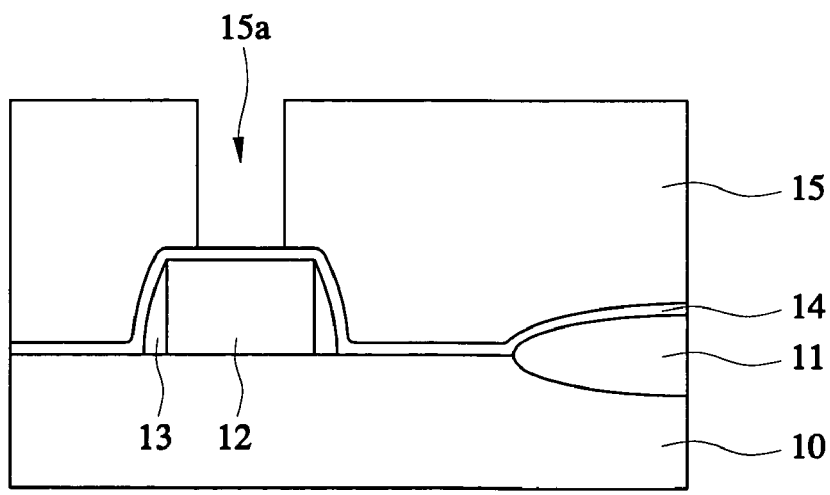
Figure 1C:
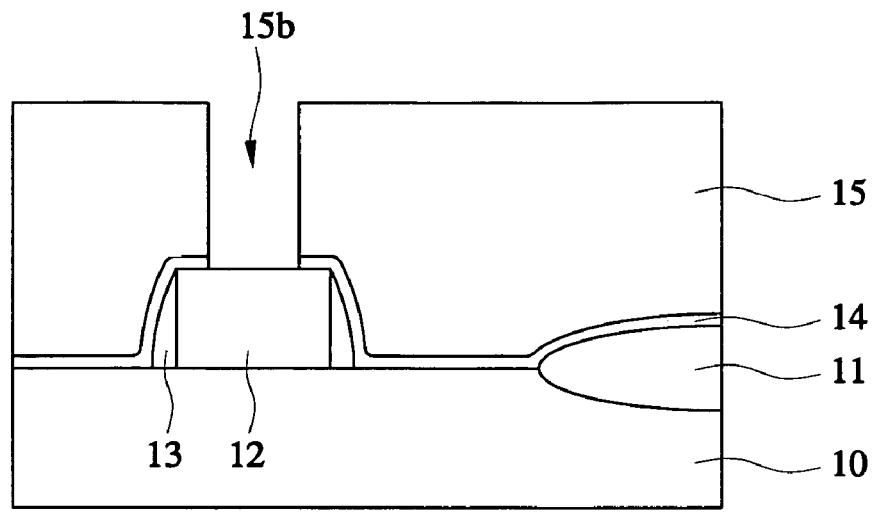
Figure 1D:
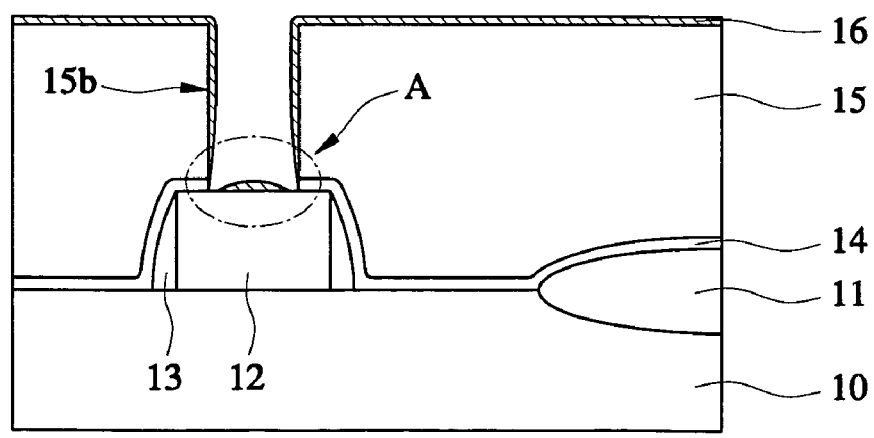
Figure 1E:
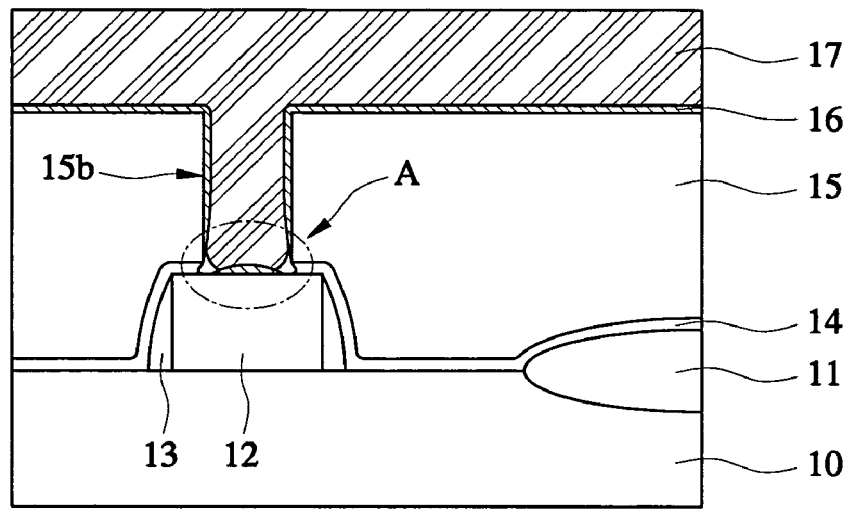
Figure 1F:
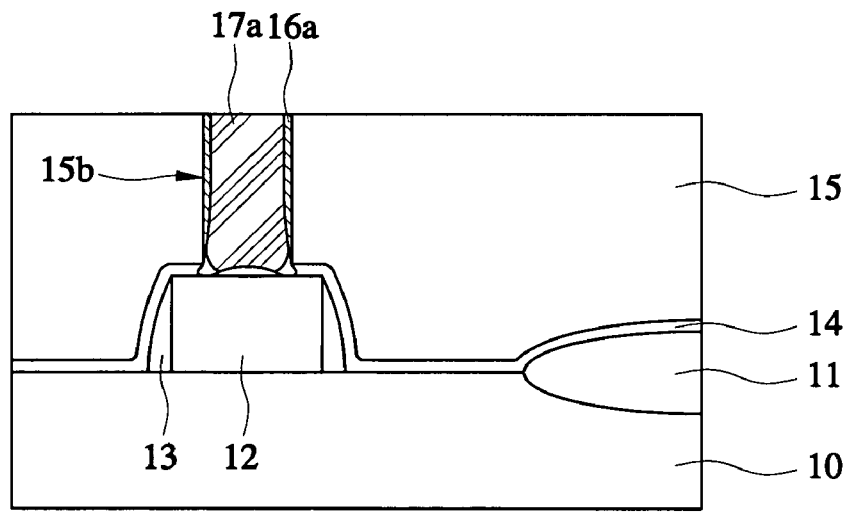
Figure 2A:
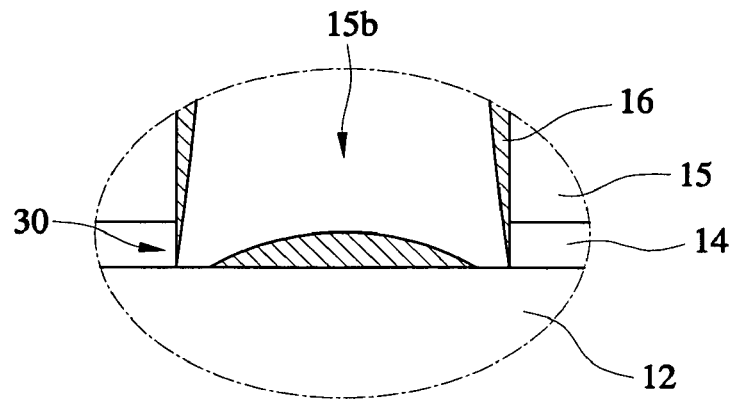
FIGS. 2A and 2B show cross-sectional views of profiles of a bottom surface of a via hole after an etch-stop layer is removed in accordance with the prior art.
Figure 2B:
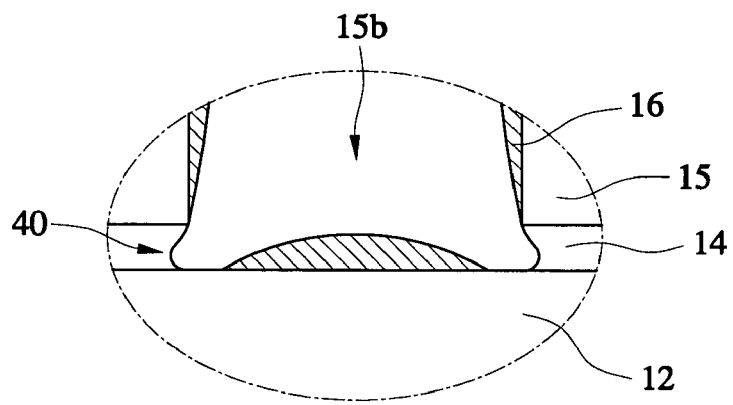
Figure 3:
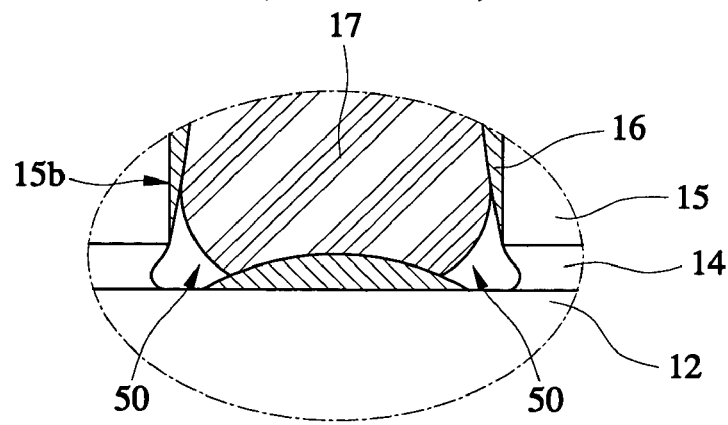
FIG. 3 shows a cross-sectional view when a void is formed within a via hole in accordance with the prior art.

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Hereinafter, a method for fabricating a semiconductor device in accordance with an exemplary embodiment of the present invention will be described with reference to FIGS. 4A to 4G and FIGS. 5A to 5E. FIGS. 5A to 5E shows partially enlarged views of the 'A' portion of FIGS. 4B to 4F, respectively.

Figure 4A:
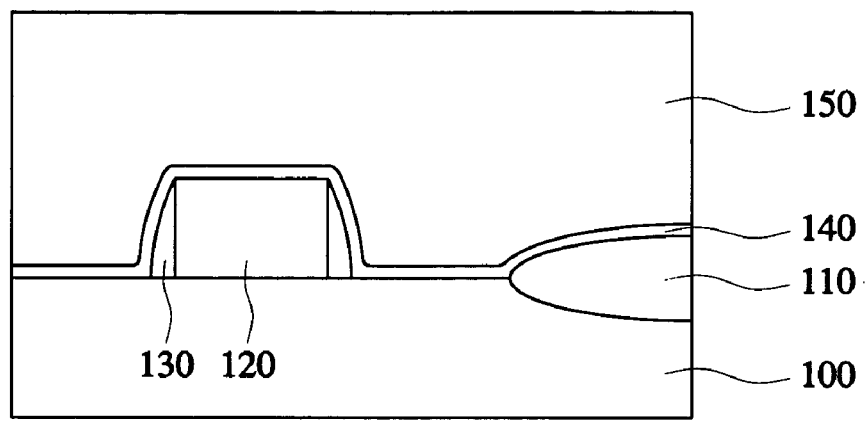
FIGS. 4A to 4G show cross-sectional views of a process of forming metal wiring in accordance with an exemplary embodiment of the present invention.

Referring to FIG. 4A, on a semiconductor substrate 100 including a completed lower structure comprising a device isolation layer 110, a gate electrode 120 as a lower conductive layer, and an insulating spacer 130, an etch-stop layer 140 and an interlayer dielectric layer 150 are formed sequentially.

The etch-stop layer 140 is preferably made of a material having an etch selection ratio with respect to the interlayer dielectric layer 150. In addition, the etch-stop layer 140 acts as a metal diffusion barrier layer for preventing metal atoms in a metal layer to be formed in a subsequent process from being diffused into the interlayer dielectric layer 150. Preferably, the etch-stop layer 140 is a material selected from the group consisting of SiN, SiC, and BCB (BenzoCycloButene) organic insulating layer. The etch-stop layer 140 is preferably formed having a thickness in the range of about 500 Å to about 1000 Å.

The interlayer dielectric layer 150 is preferably made of a low-k dielectric layer to improve an operating speed of the semiconductor device. Preferably, the interlayer dielectric layer 150 is a material selected from the group consisting of FSG (fluorinated silicate glass), SiOC, and organic or inorganic SOD (spin on dielectric).

Figure 4B:
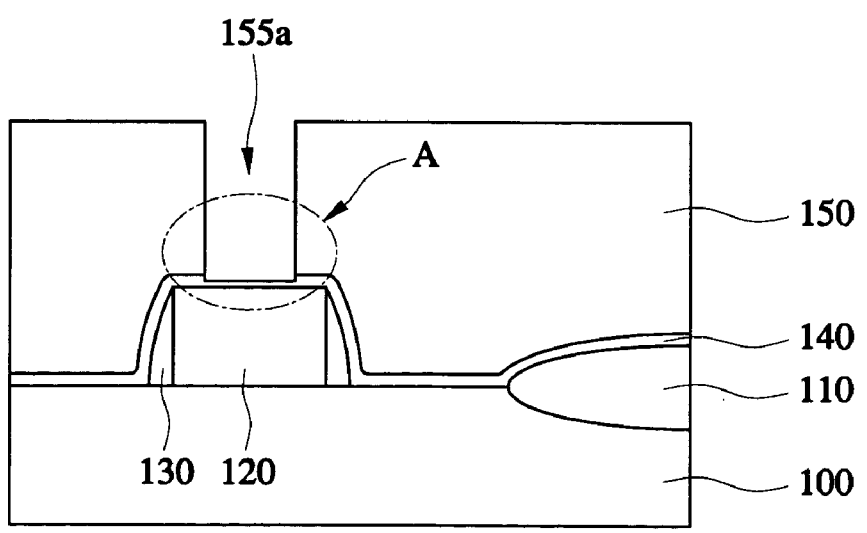
Figure 5A:
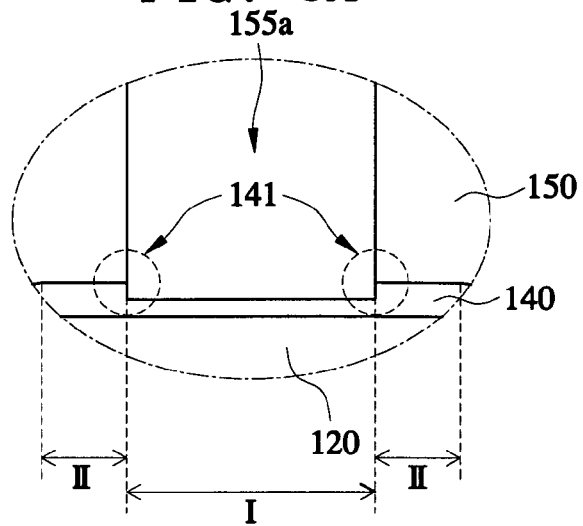
FIGS. 5A to 5E show partially enlarged views of the 'A' portion of FIGS. 4B to 4F, respectively.

Referring to FIG. 4B and FIG. 5A, at least one first preliminary via hole 155a is formed by selectively etching the interlayer dielectric layer 150 until the etch-stop layer 140 is exposed. The first preliminary via hole 155a exposes the etch-stop layer 140 on the gate electrode 120.

A step 141 is formed in the etch-stop layer 140 by removing portions of the etch-stop layer 140 exposed at the bottom surface of the first preliminary via hole 155a, as shown in FIG. 5A. Preferably, the step 141 is formed by removing about 300 Å to about 500 Å of the etch-stop layer 140. The step 141 of the etch-stop layer is formed at a boundary between a recessed portion I exposed at the bottom surface of the first preliminary via hole 155a and a raised portion II covered with the interlayer dielectric layer 150, as shown in FIG. 5A.

The step 141 of the etch-stop layer may be formed by removing portions of the etch-stop layer 140 by over-etching during a process of forming the first preliminary via hole 155a by etching the interlayer dielectric layer 150 or by an additional etching process.

Figure 4C:
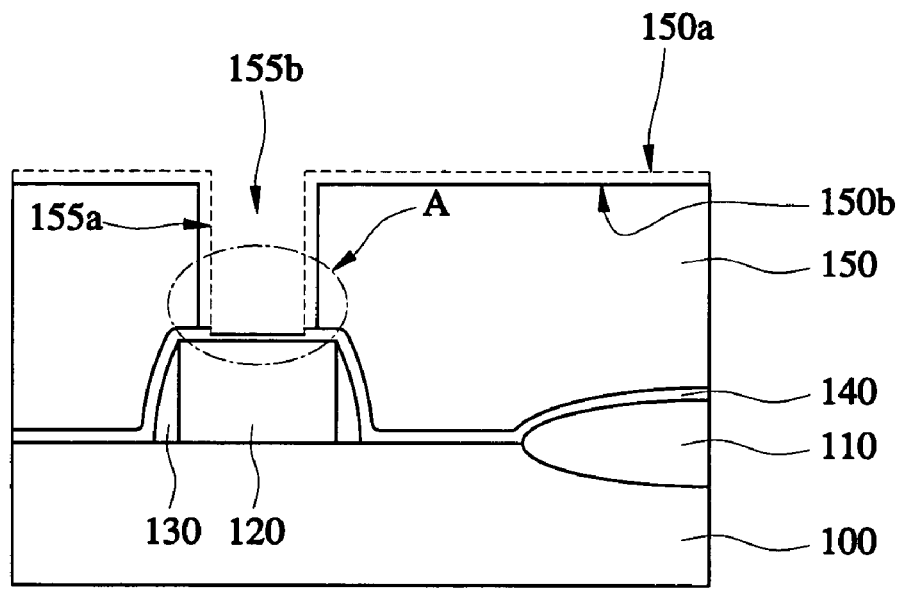
Figure 5B:
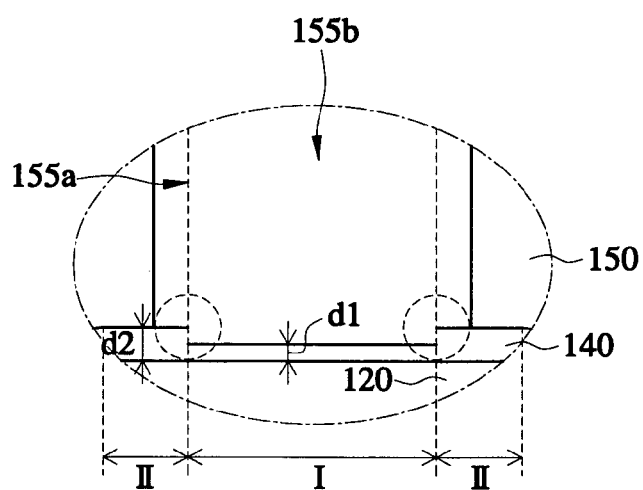

Referring to FIG. 4C and FIG. 5B, a second preliminary via hole 155b is formed by laterally expanding the first preliminary via hole 155a. The process of laterally expanding the preliminary via hole comprises a step of removing portions of the interlayer dielectric layer 150 where the first preliminary via hole 155a is already formed by dry etching using plasma or wet etching using an HF solution. In accordance with the process of expanding the preliminary via hole, portions of the raised portion II of the etch-stop layer 140 covered with the interlayer dielectric layer 150 are exposed at the bottom surface of the second preliminary via hole 155b. Thus, the etch-stop layer 140 exposed at the bottom surface of the second preliminary via hole 155b varies in thickness. In other words, as can be seen from the FIG. 5B, the thickness d1 of the recessed portion I of the etch-stop layer 140 exposed at the bottom surface of the second preliminary via hole 155b is thinner than the thickness d2 of the raised portion II. Referring to FIG. 4C and FIG. 5B, numerical references 150a and 150b indicate both surfaces of the interlayer dielectric layer before and after performing the process of expanding the preliminary via hole, respectively.

Figure 4D:
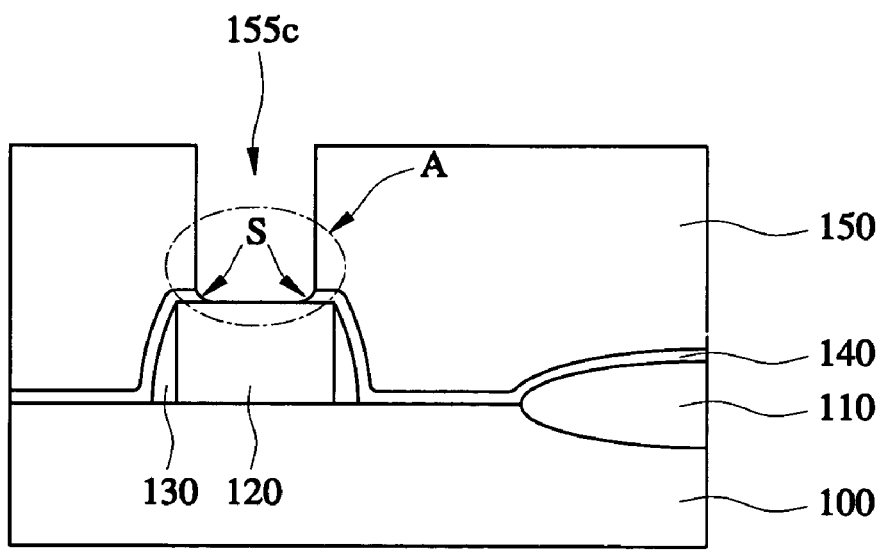
Figure 5C:
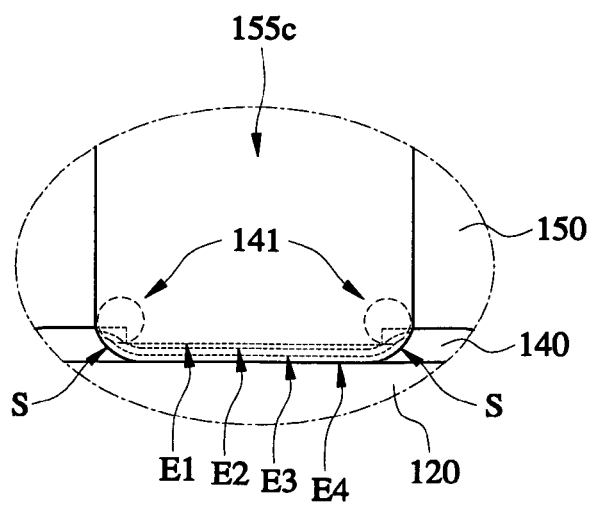

Referring to FIG. 4D and FIG. 5C, a via hole 155c is formed to expose the gate electrode 120 as a lower conductive layer by anisotropic etching the etch-stop layer 140 at the bottom surface of the second preliminary via hole 155b.

In this case, the via hole 155c includes a residual portion of the etch stop layer 140 having a slope S at lower sides of the via hole 155c. In other words, as mentioned above, the residual portion of the etch stop 140 having the slope S is formed at the lower sides of the via hole 155c because the thickness d1 of the recessed portion I of the etch-stop layer 140 exposed at the bottom surface of the second preliminary via hole 155b is thinner than the thickness d2 of the raised portion II. In addition, at an initial stage of the anisotropic etching process, relatively active etching is progressed at an edge of the step 141 of the etch-stop layer 140. Once the surface of the etch-stop layer 140 reaches the 'E4' through 'E1', 'E2', and 'E3' while the anisotropic etching process is performed, as can be seen from FIG. 5C, the residual of the etch-stop layer 140 having the slope S is formed at the lower sides of the via hole 155c. In other words, due to the thickness difference of the exposed recessed portion I and raised portion II, the residual of etch-stop layer 140 having the slope S is formed at the lower sides of the via hole 155c, wherein the residual etch-stop layer 140 having the slope S reduces in thickness from the lower sides of the via hole 155c to the center of the via hole 155c.

Figure 4E:
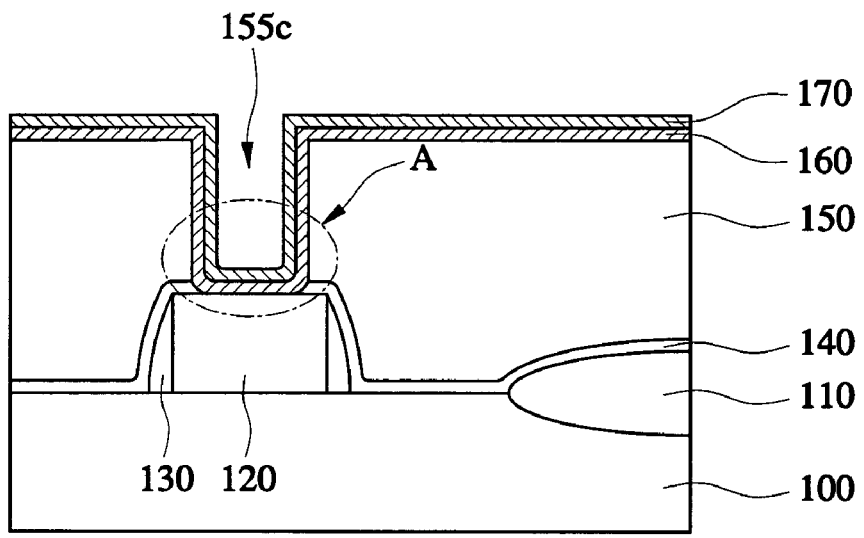
Figure 5D:
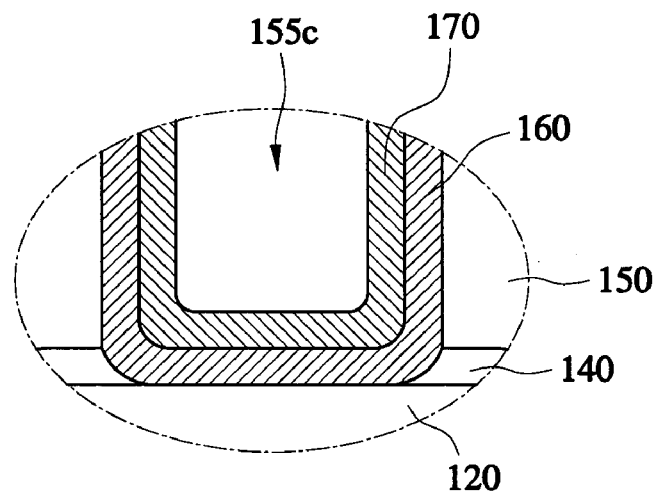

Referring to FIG. 4E and FIG. 5D, a metal diffusion barrier layer 160 and a seed layer 170 are sequentially formed by a physical vapor deposition method, thereby covering the interlayer dielectric layer 150 on the via hole 155c and the exposed gate electrode 120. The seed layer 170 is connected to an electrode in a subsequent process of forming a metal layer by an electrochemical deposition method. The metal diffusion barrier layer 160 may remain in some cases. In one exemplary embodiment, the metal diffusion barrier layer 160 is made of TiN or TaN. The seed layer 170 is made of Cu having a deposition thickness of about 150 Å to about 350 Å. In the meantime, by forming the residual of the etch-stop layer 140 having slope S at lower sides of the via hole 155c in accordance with the above mentioned process, good step coverage of the metal diffusion barrier layer 160 and seed layer 170 can be obtained.

Figure 4F:
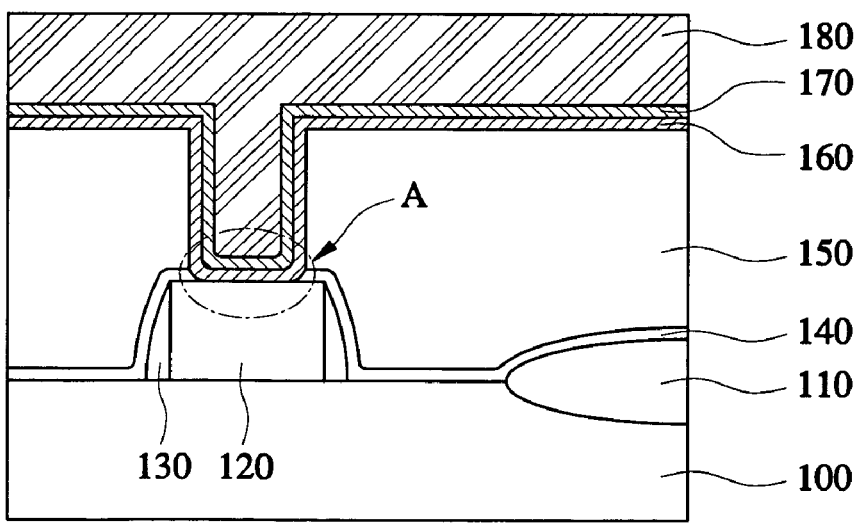
Figure 5E:
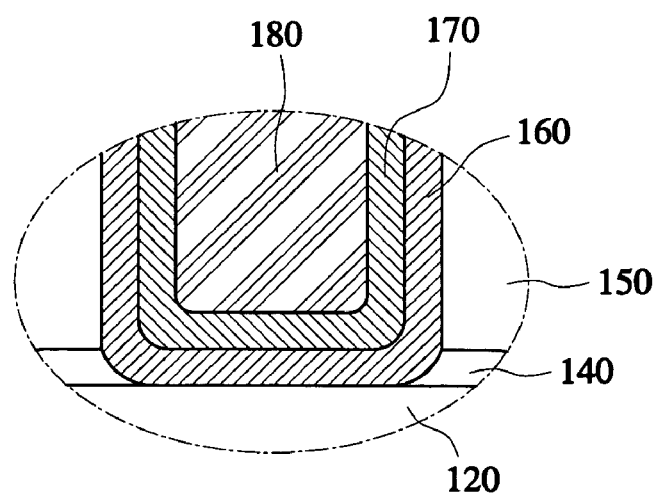

Referring to FIG. 4F and FIG. 5E, a metal layer 180 is formed on the seed layer 170 by a electrochemical deposition method. Preferably, a copper layer is used for the metal layer 180. Preferably, an electrolyte solution comprising $H_2SO_4$ and CuCl is used, and the copper layer is formed under conditions where current is about 1 A to about 10 A and temperature is about 20° C. to about 25° C.

Figure 4G:
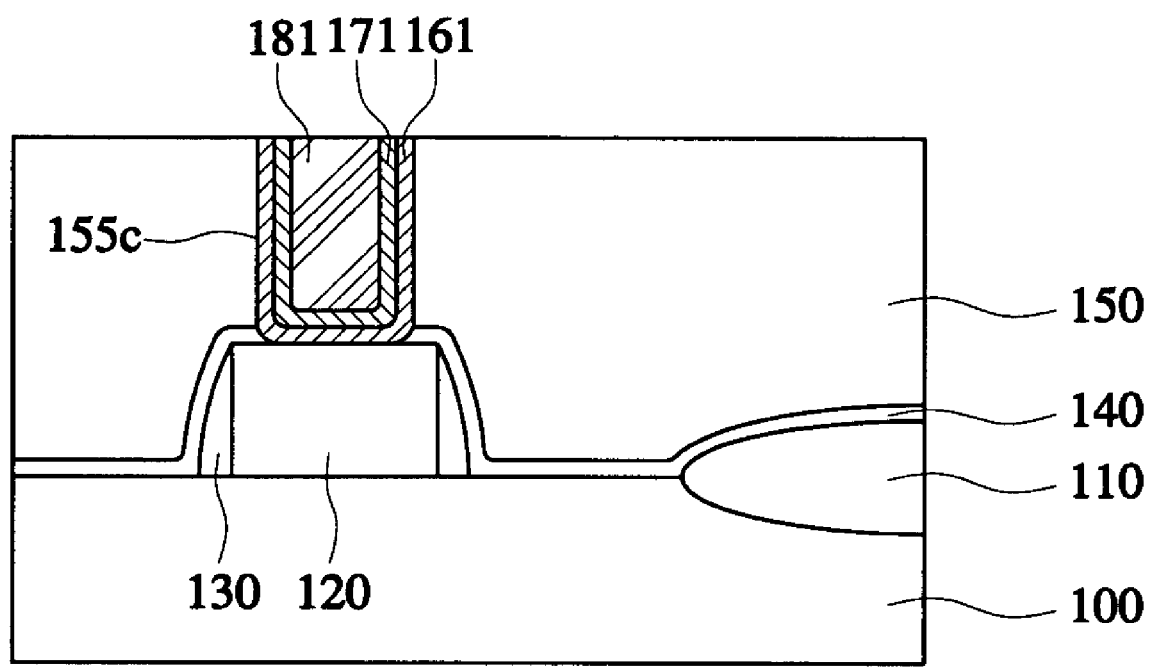

Referring to FIG. 4G, the metal diffusion barrier layer 160, the seed layer 170, and the metal layer 180 are patterned to form metal wiring. The patterning is performed by a photolithography process or a CMP process depending on the type of metal used to form the metal layer 180. In the present embodiment, the metal diffusion barrier layer 160, the seed layer 170, and the metal layer 180 are polished until the surface of the interlayer dielectric layer 150 is exposed, thereby forming a metal diffusion barrier layer pattern 161, a seed layer pattern 171, and a metal layer pattern 181 within the via hole 155c.

The above-mentioned exemplary embodiments describe the via hole formation as an exemplary interconnection hole, however, the present invention can be applied to a case of forming a contact hole instead of the via hole. In this case, a doping region formed in the semiconductor substrate is exposed at the bottom surface of the contact hole.

In addition, the present invention may be applied to a method for forming the metal wiring using a dual damascene process.

Hereinafter, a method for fabricating metal wiring of the semiconductor device in accordance with another exemplary embodiment of the present invention will be described with reference to FIGS. 6A to 6H.

Figure 6A:
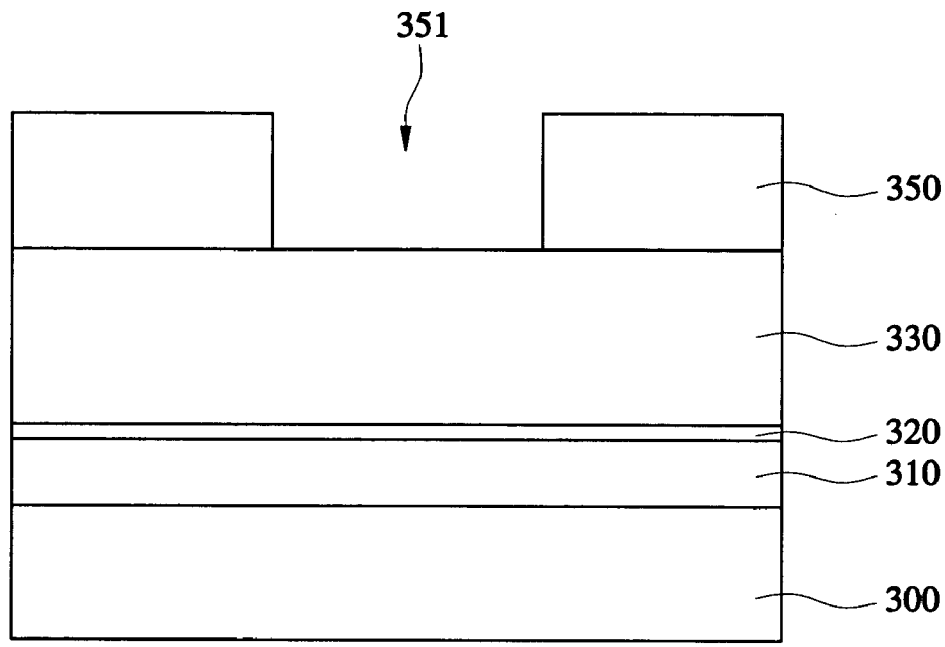
FIGS. 6A to 6I show cross-sectional views of a process of forming metal wiring in accordance with another exemplary embodiment of the present invention.

Referring to FIG. 6A, an etch-stop layer 320 and an interlayer dielectric layer 330 are formed on a semiconductor substrate 300 having a lower conductive layer 310. The lower conductive layer 310 may be a doping layer formed on the surface of the semiconductor substrate 300. The etch-stop layer 320 has the same function as the etch-stop layer 140 of the exemplary embodiments of FIGS. 4A–4G, and may be formed of the same material.

A trench etch mask 350 is then formed on the interlayer dielectric layer 330. The trench etch mask 350 has an opening 351 for defining an upper metal wiring region.

Figure 6B:
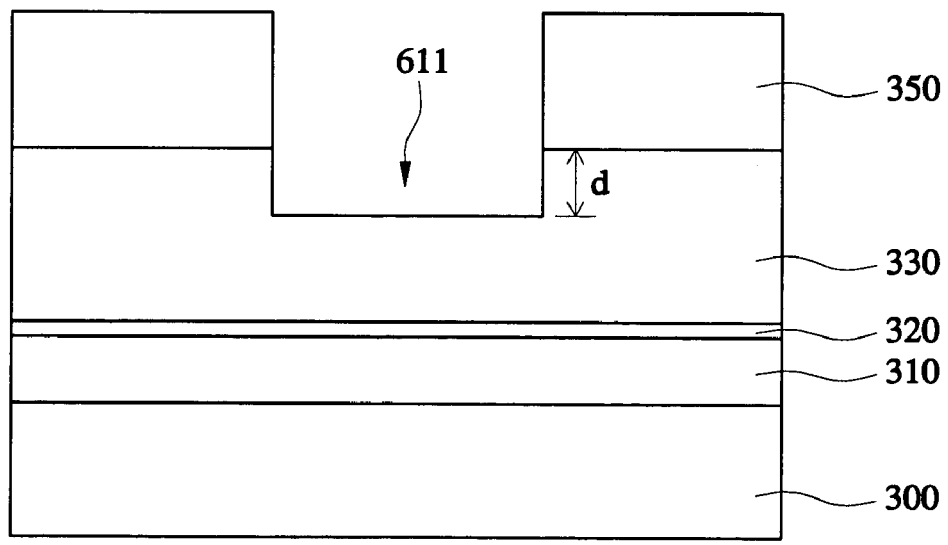

Referring to FIG. 6B, a preliminary trench 611 is formed by etching portions of the interlayer dielectric layer 330 exposed at the bottom surface of the opening 351.

In the meantime, an etching end point for forming the preliminary trench 611 may be determined by an etch rate and an etching time of the interlayer dielectric layer 330. Alternatively, the etching end point may be determined by forming a trench etch-stop layer (now shown) at a predetermined depth of the bottom surface of the preliminary trench 611. In this case, the interlayer dielectric layer 330 is formed above and below the trench etch-stop layer. When the trench etch-stop layer is formed, the desired location of the trench etch-stop layer is determined by the thickness of the upper metal wiring.

Figure 6C:
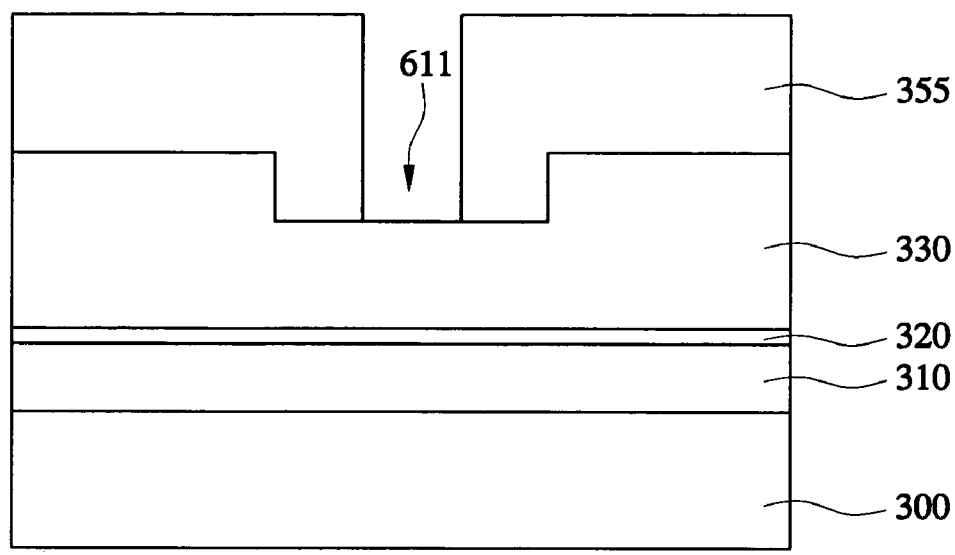

Referring to FIG. 6C, the trench etch mask 350 is removed. A contact hole etch mask 355 is then formed on the interlayer dielectric layer 330 where the preliminary trench 611 is already formed, thereby exposing the interlayer dielectric layer 330 at the bottom surface of the preliminary trench 611.

Figure 6D:
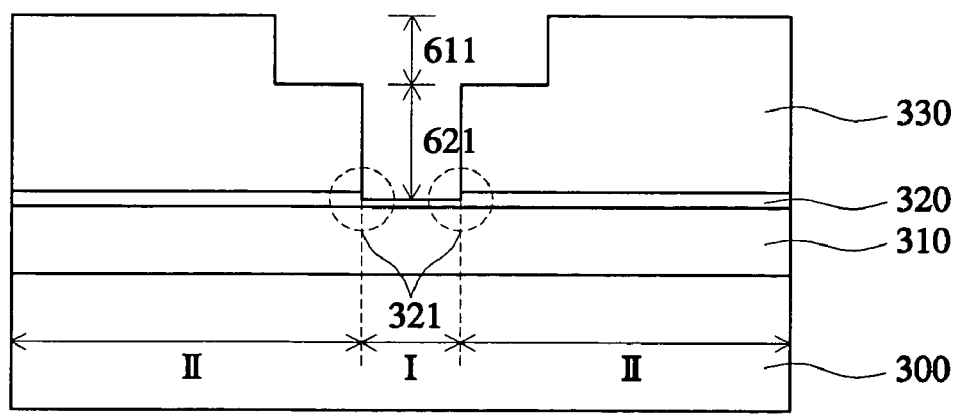

Referring to FIG. 6D, the interlayer dielectric layer 330 is selectively etched until the etch-stop layer 320 is exposed so that a first preliminary contact hole 621 is formed through the interlayer dielectric layer 330 and connected to the preliminary trench 611.

A step 321 is then formed on the etch-stop layer 320 by removing portions of the etch-stop layer 320 exposed at the bottom surface of the first preliminary contact hole 621. In one exemplary embodiment, the step 321 is formed by removing about 300 Å to about 500 Å of the etch-stop layer 320. The step 321 of the etch-stop layer is formed at a boundary between the recessed portion I exposed at the bottom surface of the first preliminary contact hole 621 and the raised portion II covered with the interlayer dielectric layer 330. The step 321 of the etch-stop layer 320 may be formed by removing portions of the etch-stop layer 320 by over-etching during a process of forming the first preliminary contact hole 621 by etching the interlayer dielectric layer 330, or by an additional etching process. Next, the contact hole etch mask 355 is removed.

Figure 6E:
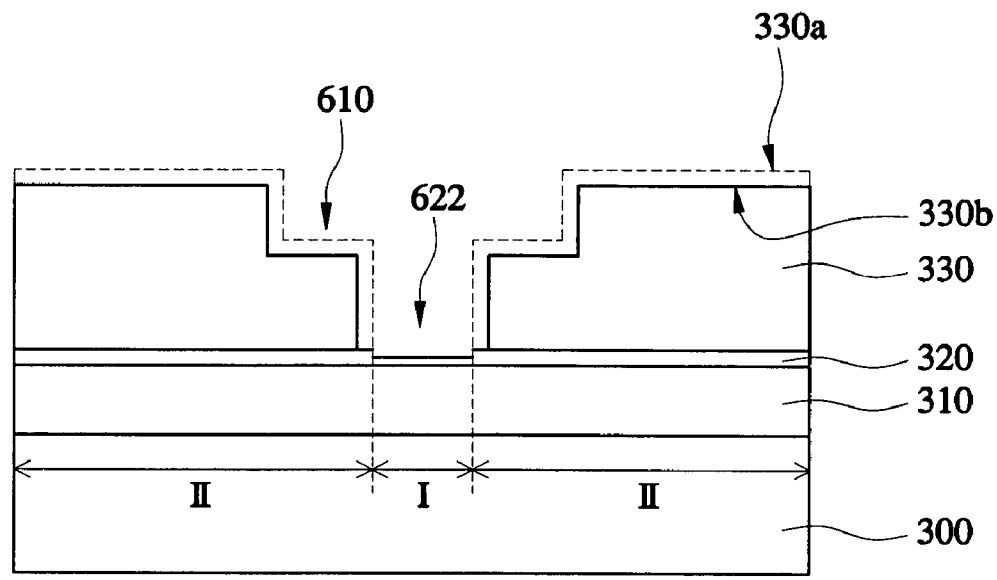

Referring to FIG. 6E, a second preliminary contact hole 622 is formed by laterally expanding the first preliminary contact hole 621. The process of laterally expanding the first preliminary contact hole comprises a step of removing portions of the interlayer dielectric layer 330 where the first preliminary contact hole 621 is already formed by dry etching using plasma or wet etching using an HF solution. In accordance with the process of expanding the preliminary contact hole, portions of the raised portion II of the etch-stop layer 320 covered with the interlayer dielectric layer 330 are exposed at the bottom surface of the second preliminary via hole 622.

During the process of expanding the first preliminary contact hole 621, portions of interlayer dielectric layer 330 are removed while the preliminary trench 611 is also expanded, thereby forming a trench 610. Numerical references 330a and 330b in FIG. 6E indicate both surfaces of the interlayer dielectric layer before and after performing the process of expanding the preliminary contact hole, respectively.

Figure 6F:
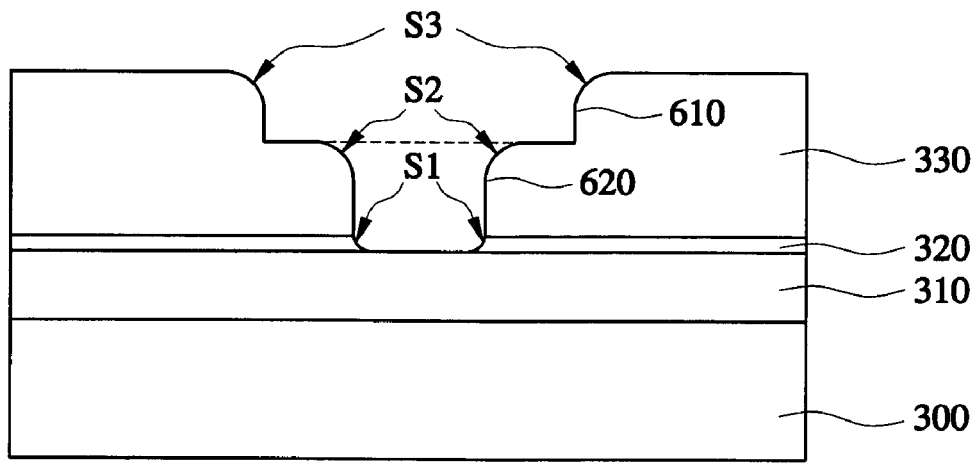

Referring to FIG. 6F, the etch-stop layer 320 at the bottom surface of the second preliminary contact hole 622 is anisotropically etched, thereby exposing the lower conductive layer 310 and forming a contact hole 620 connected to the trench 610. In this case, by the thickness difference of the recessed portion I and the raised portion II, a residual portion of the etch-stop layer 320 having a slope S1 is formed at lower sides of the contact hole 620.

In the meantime, during the anisotropic etching process, the interlayer dielectric layer 330 at each entrance of the trench 610 and the contact hole 620 is also physically etched, thereby forming additional slopes S2 and S3.

Figure 6G:
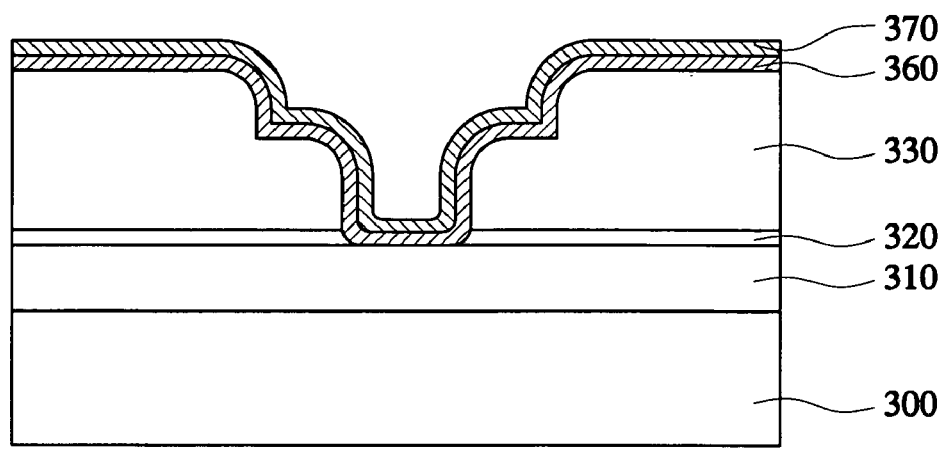
Figure 6H:
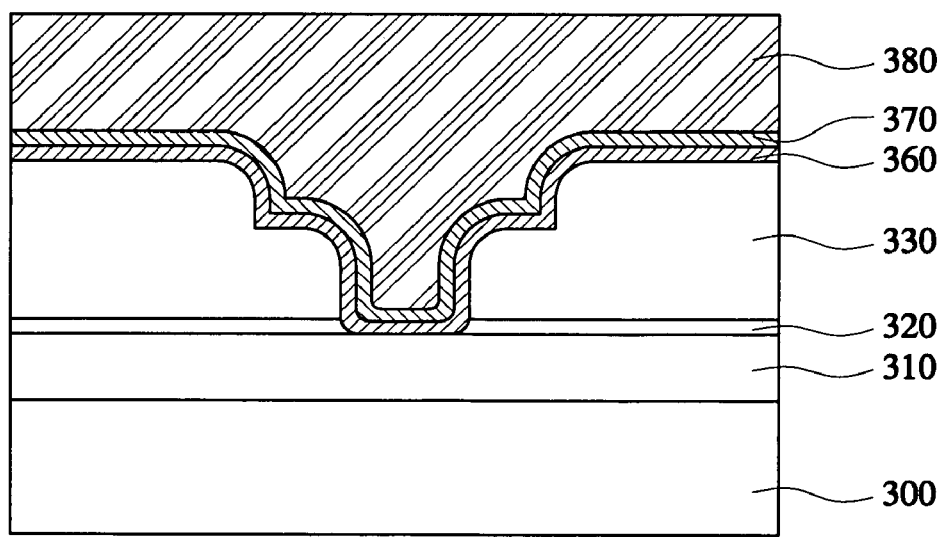

Referring to FIG. 6G, a metal diffusion barrier layer 360 and a seed layer 370 are sequentially formed by a physical vapor deposition method, thereby covering the exposed lower conductive layer 310 and the interlayer dielectric layer 330 where the contact hole 620 is already formed.

By forming the residual of the etch-stop layer 320 having the slope S at lower sides of the contact hole 620 in accordance with the above mentioned process, the formation of the metal diffusion barrier layer 360 and the seed layer 370 having good step coverage can be obtained.

Referring to Fla 6H, a metal layer 380 is formed on the seed layer 370 by a electrochemical deposition method. The metal layer 380 is formed by the same method as the metal layer 180 of the exemplary embodiments of FIGS. 4A-4G.

Figure 6I:
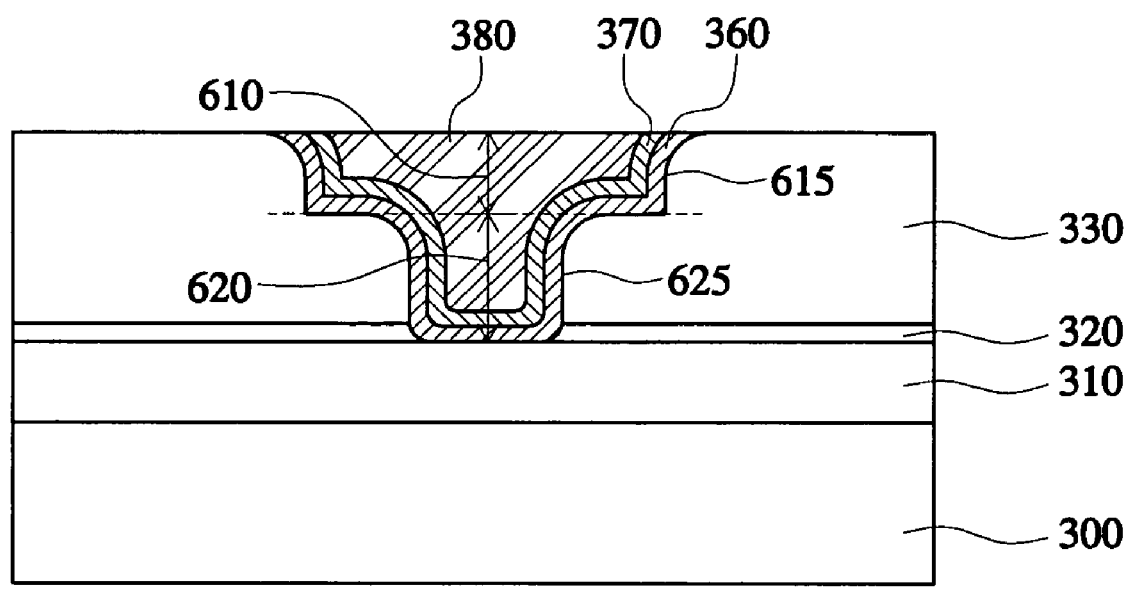

Referring to FIG. 6I, a metal layer 380, a seed layer 370, and a metal diffusion barrier layer 360 are polished until a surface of the interlayer dielectric layer 330 is exposed so that upper metal wiring 615 and a plug 625 are formed within the trench 610 and the contact hole 620, respectively.

A preliminary interconnection hole may be formed before forming the trench in a dual damascene process.

Hereinafter, a method for fabricating metal wiring of a semiconductor device in accordance with another exemplary embodiment of the present invention will be described with reference to FIGS. 7A to 7G.

Figure 7A:
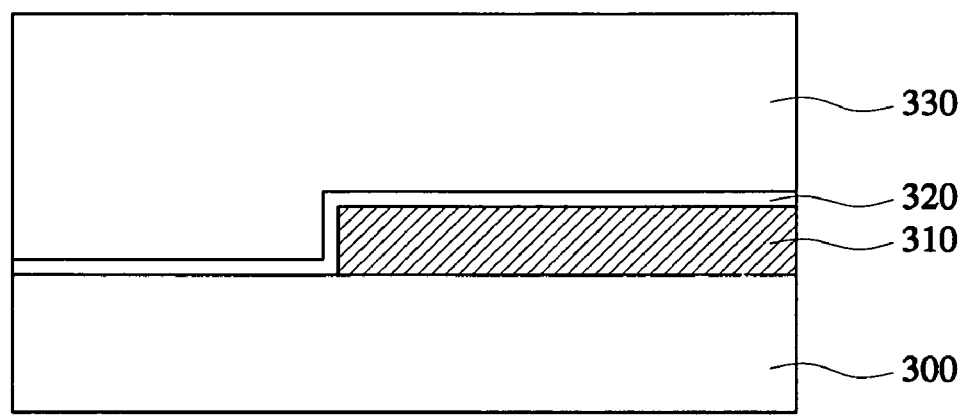
FIGS. 7A to 7J show cross-sectional views of a process of forming a via hole of metal wiring in accordance with another exemplary embodiment of the present invention.

Referring to FIG. 7A, an etch-stop layer 320 and an interlayer dielectric layer 330 are formed on a semiconductor structure 300 having a lower conductive layer 310. In the present embodiment, the lower conductive layer 310 is lower metal wiring. In this case, the interlayer dielectric layer 330 acts as an inter-metal dielectric layer.

Figure 7B:
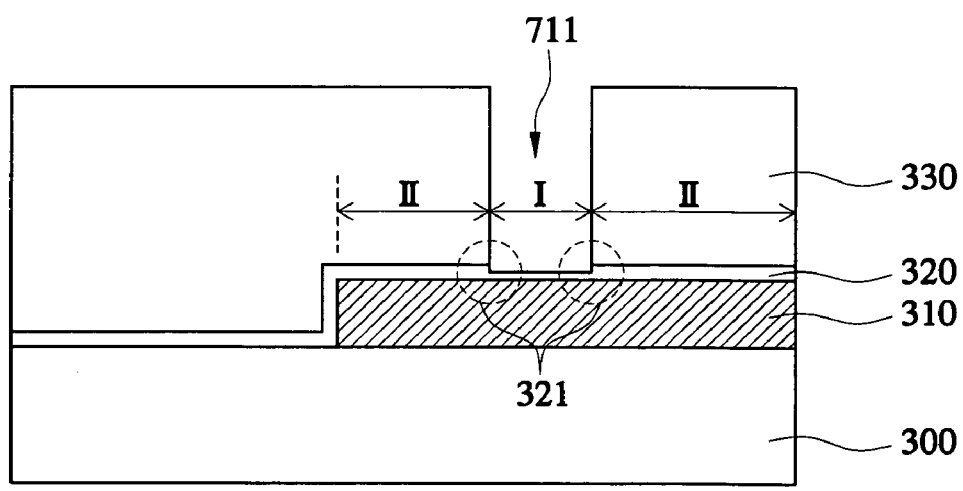

Referring to FIG. 7B, the interlayer dielectric layer 330 is selectively etched until the etch-stop layer 320 is exposed so that a first preliminary via hole 711 is formed through the interlayer dielectric layer 330.

Portions of the etch-stop layer 320 exposed at the bottom surface of the first preliminary via hole 711 are removed so that a step 321 is formed in the etch-stop layer 320. The step 321 of the etch-stop layer 320 is formed at a boundary between the recessed portion I exposed at the bottom surface of the first preliminary via hole 711 and raised portions II covered with the interlayer dielectric layer 330. The step 321 of the etch-stop layer 320 may be formed by removing portions of the etch-stop layer 320 by over-etching during a process of forming the first preliminary via hole 711 by etching the interlayer dielectric layer 330, or by an additional etching process.

Figure 7C:
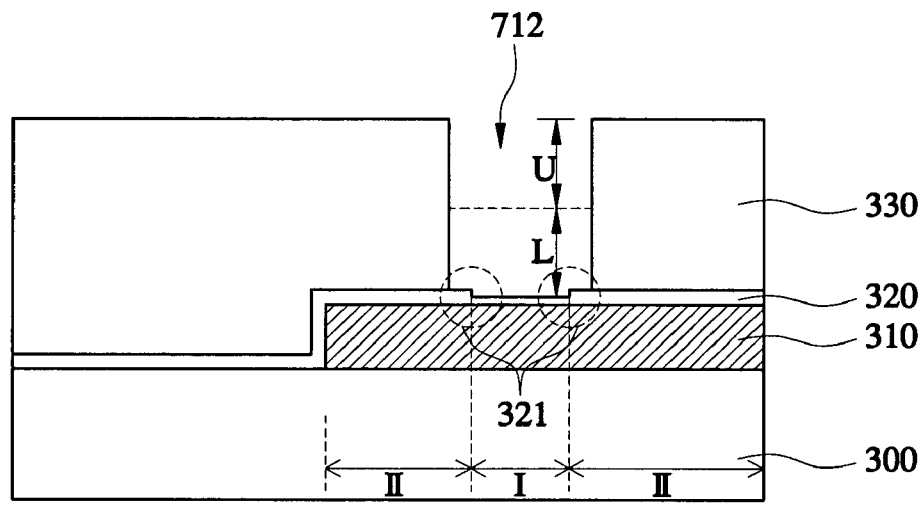

Referring to FIG. 7C, a process of expanding the first preliminary via hole 711 is performed to form a second preliminary via hole 712. The second preliminary via hole 712 comprises an upper region U and a lower region L. The upper region U is included in an upper metal wiring region to be formed in a subsequent process, and the lower region L is included in a via region for connecting the upper metal wiring and the lower metal wiring.

The process of expanding the first preliminary via hole comprises a step of removing portions of the interlayer dielectric layer 330 where the first preliminary via hole 711 is already formed by dry etching using plasma or wet etching using an HF solution. Portions of the raised portion II of the etch-stop layer 320 covered with the interlayer dielectric layer 330 are exposed at the bottom surface of the second preliminary via hole 712 in accordance with the process of expanding the preliminary via hole.

Figure 7D:
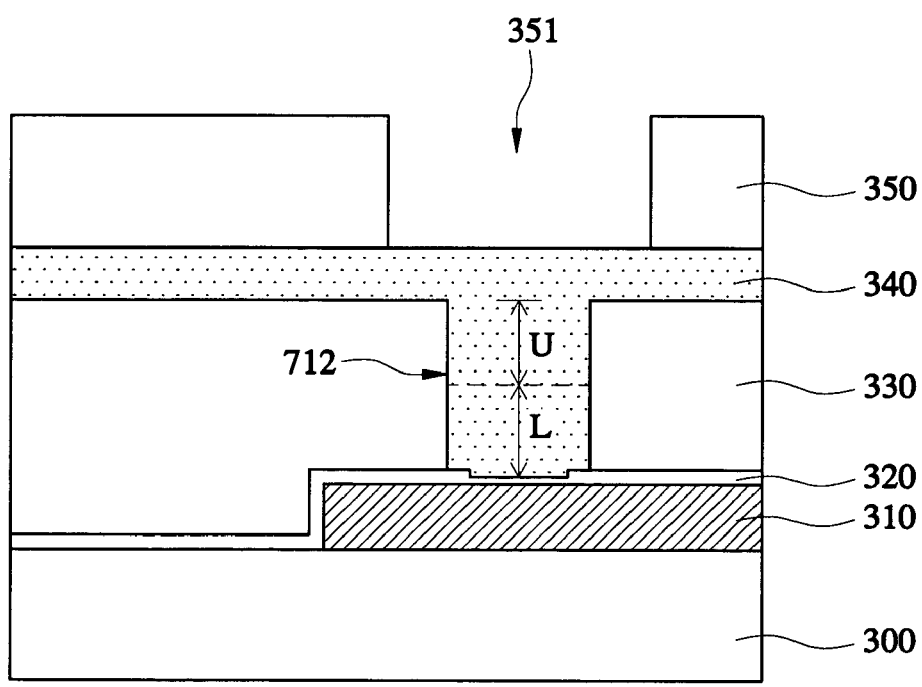

Referring to FIG. 7D, a sacrificial layer 340 is formed at least within the lower region L of the second preliminary via hole 712. A trench etch mask 350 is formed on the semiconductor substrate 300 where the sacrificial layer 340 is already formed. The trench etch mask 350 has an opening 351 for defining the upper metal wiring region. The opening 351 is formed on the second preliminary via hole 712 and has a relatively wider width than the second preliminary via hole 712.

The sacrificial layer 340 is preferably made of a material capable of being removed without damaging the interlayer dielectric layer 330. In the present embodiment, the sacrificial layer 340 is formed by performing spin coating of an organic or inorganic material such as photoresist irradiated with light having an i line wavelength. As such, when the sacrificial layer 340 is formed by the spin coating method, as can be seen from FIG. 7D, an upper surface of the interlayer dielectric layer 330 may be covered with the sacrificial layer 340.

Figure 7E:
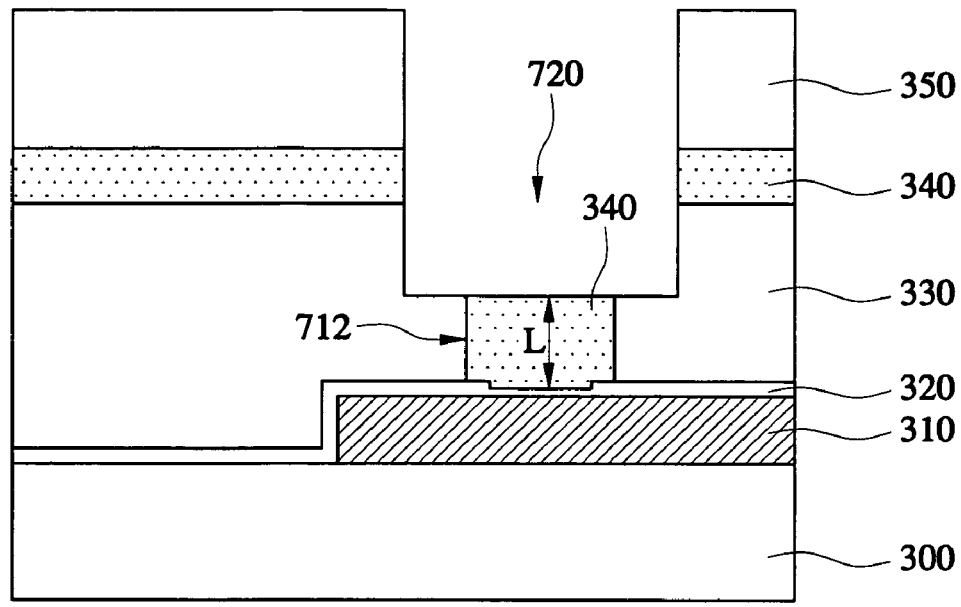

Referring to FIG. 7E, portions of the sacrificial layer 340 and the interlayer dielectric layer 330 that are not covered with the trench etch mask 350 are etched, thereby forming a trench 720. The depth of the trench 7290 is equal to the thickness of the upper metal wiring to be formed in a subsequent process. The trench 720 is formed by laterally expanding the upper region U of the second preliminary via hole 712 and is connected to the lower region L of the second preliminary via hole 712. In the meantime, when the upper region U of the second preliminary via hole 712 is filled with the sacrificial layer 340, the sacrificial layer 340 of the upper region U of the second preliminary via hole 712 is also removed during a process of etching the interlayer dielectric layer 330, and the lower region L of the second preliminary via hole 712 is protected by the sacrificial layer 340 filled in the lower region L, thereby preventing any damage to the lower region L.

In the meantime, an etching end point for forming the trench 720 may be determined by an etch rate and an etching time of the interlayer dielectric layer 330. Alternatively, the etching end point may be determined by forming an etch-stop layer at a depth of the bottom surface of the trench 720. In this case, the interlayer dielectric layer 330 is formed above and below the etch-stop layer.

Figure 7F:
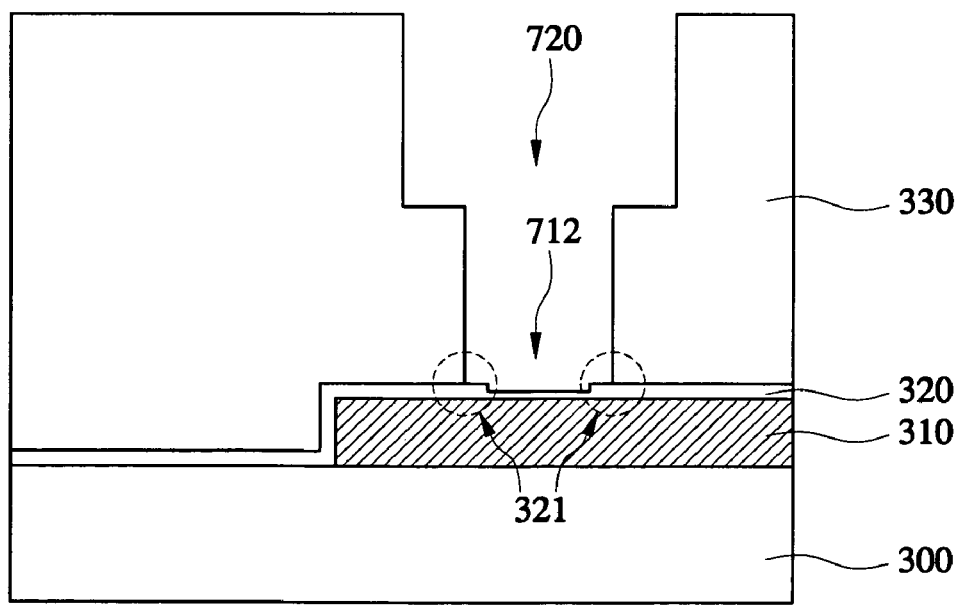

Referring to FIG. 7F, portions of the raised portion II of the etch-stop layer 320 are again exposed at the bottom surface of the second preliminary via hole 712 by removing the trench etch mask 350 and the sacrificial layer 340 in the lower region L.

Figure 7G:
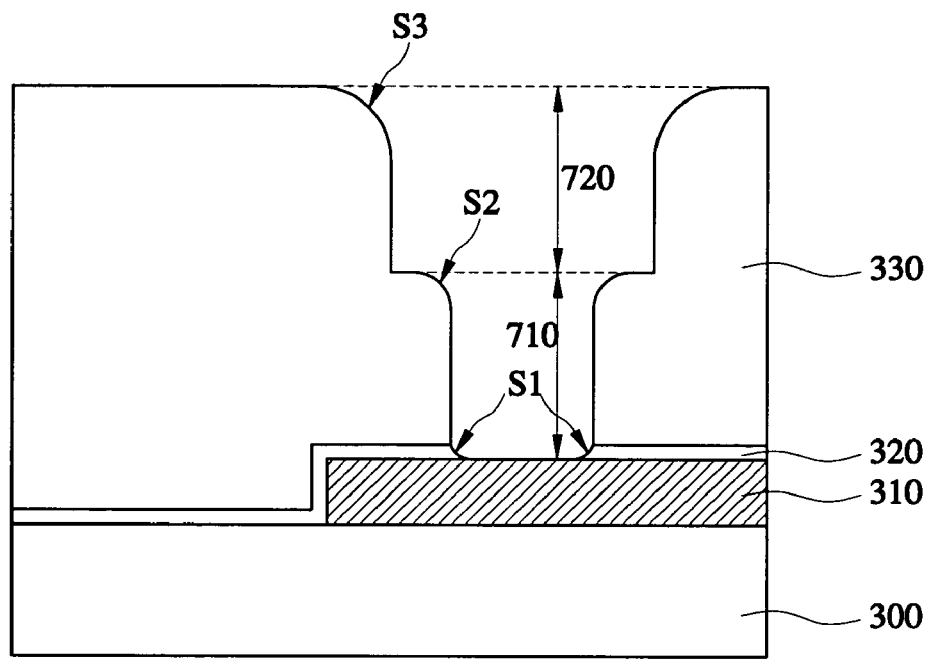

Referring to FIG. 7G, the etch-stop layer 320 at the bottom surface of the second preliminary via hole 712 is anisotropically etched so that a via hole 710 for exposing the lower metal wiring 310 is formed. In this case, due to the difference in thickness of the recessed portion I and the raised portions II, a residual portion of the etch-stop layer 320 having a slope S is formed at lower sides of the via hole 710.

In the meantime, during the anisotropic etching process, the interlayer dielectric layer 330 at each entrance of the trench 720 and the via hole 710 is also physically etched, thereby forming additional slopes S2 and S3.

Figure 7H:
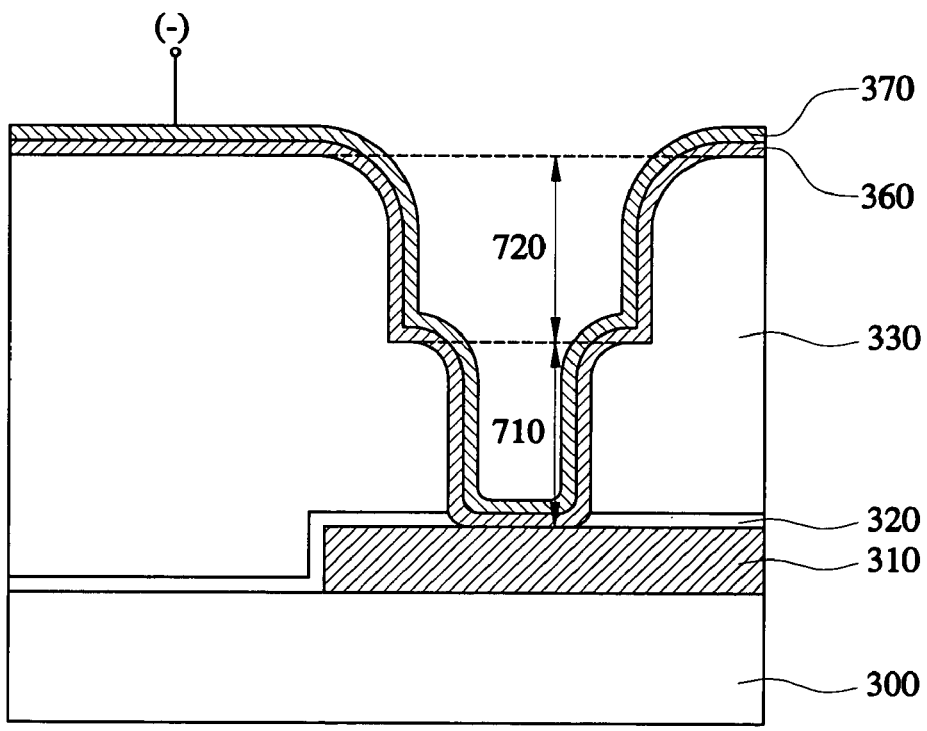

Referring to FIG. 7H, a metal diffusion barrier layer 360 and a seed layer 370 are sequentially formed by a physical vapor deposition method, thereby covering the exposed lower conductive layer 310 and the interlayer dielectric layer 330 where the via hole 710 and the trench 720 are already formed.

By having the residual portion of the etch-stop layer 320 having the slope SI at the lower sides of the via hole 710, in accordance with the above mentioned process, the formation of the metal diffusion barrier layer 360 and the seed layer 370 having good step coverage can be obtained.

Figure 7I:
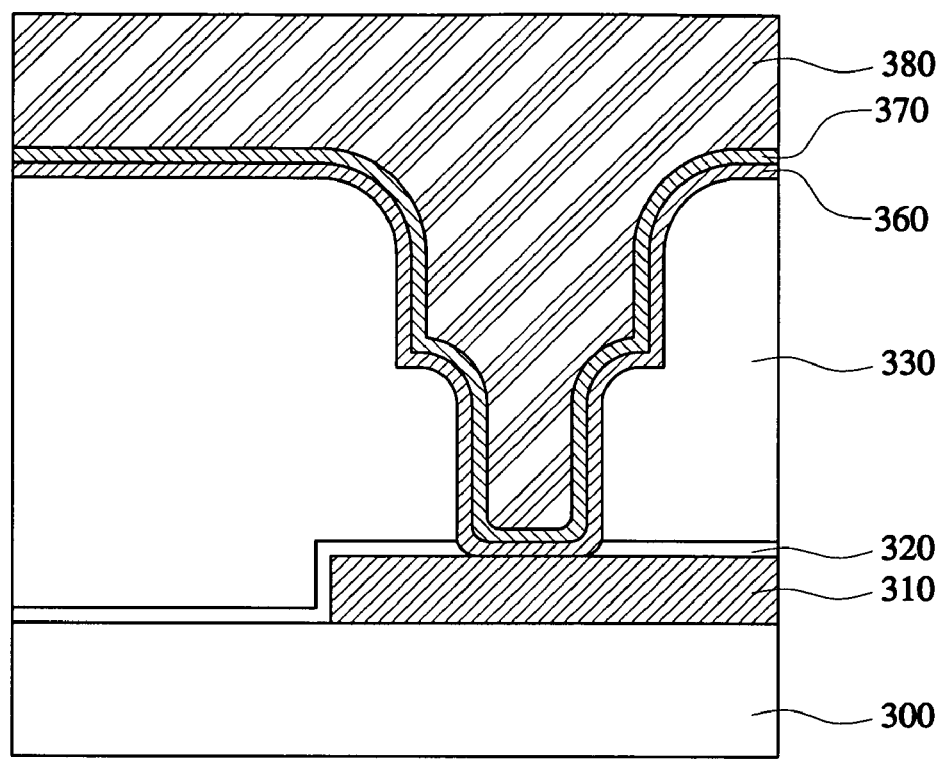

Referring to FIG. 7I, a metal layer 380 is formed on the seed layer 370 by the same method as the exemplary embodiments of FIGS. 6A–6I.

Figure 7J:
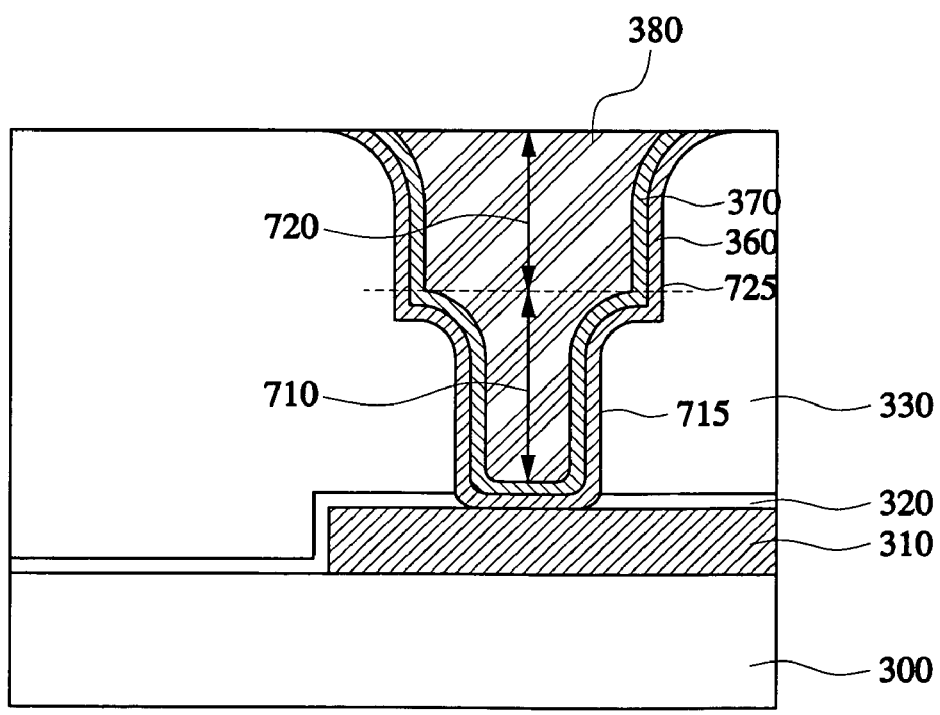

Referring to FIG. 7J, the metal layer 380, the seed layer 370, and the metal diffusion barrier layer 360 are polished until the surface of the interlayer dielectric layer 330 is exposed so that upper metal wiring 725 and a via 715 are formed within the trench 720 and the via hole 710, respectively.

In a process of forming the metal wiring using a dual damascence process, the process of expanding the preliminary via hole may be performed to expose the raised portion of the etch-stop layer after removing the sacrificial layer.

Hereinafter, a method for fabricating metal wiring of a semiconductor device in accordance with another exemplary embodiment of the present invention will be described with reference to FIGS. 8A to 8E.

Figure 8A:
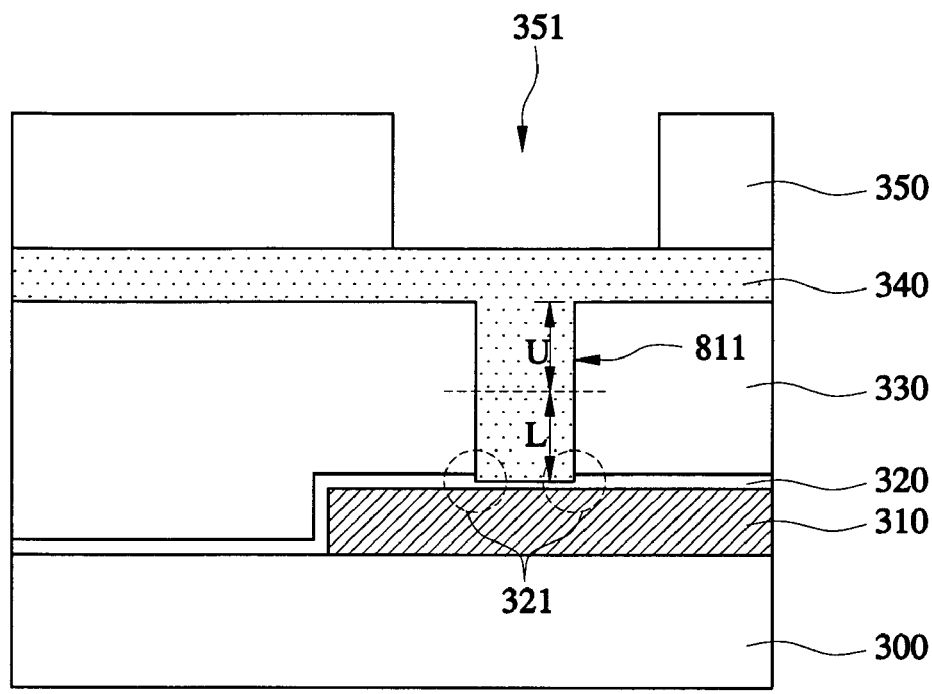
FIGS. 8A to 8E show cross-sectional views of a process of forming a via hole of metal wiring in accordance with another exemplary embodiment of the present invention.

Referring to FIG. 8A, on a semiconductor substrate 300 on which a lower conductive layer 310 is formed as lower metal wiring, an etch-stop layer 320, and an interlayer dielectric layer 330 acting as an inter-metal dielectric layer are formed. The interlayer dielectric layer 330 is selectively etched until the etch-stop layer 320 is exposed, thereby forming a first preliminary via hole 811. By removing portions of the etch-stop layer 320 exposed at a bottom surface of the first preliminary via hole 811, a step 321 is formed in the etch-stop layer 320, which is formed at a boundary between the recessed portion I exposed at the bottom surface of the first preliminary via hole 811 and the raised portion II covered with the interlayer dielectric layer 330, as shown in FIG. 8D.

In the meantime, the first preliminary via hole 811 comprises an upper region U and a lower region L. The upper region U is included in an upper metal wiring region to be formed in a subsequent process, and the lower region L is included in a via region for connecting the upper metal wiring and the lower metal wiring.

Next, a sacrificial layer 340 is formed at least within the lower region L of the first preliminary via hole 811. A trench etch mask 350 is formed on the semiconductor substrate 300 where the sacrificial layer 340 is already formed. The trench etch mask 350 has an opening 351 for defining the upper metal wiring forming region. The opening 351 is formed on the first preliminary via hole 811 and has a relatively wider width than the first preliminary via hole 811.

Figure 8B:
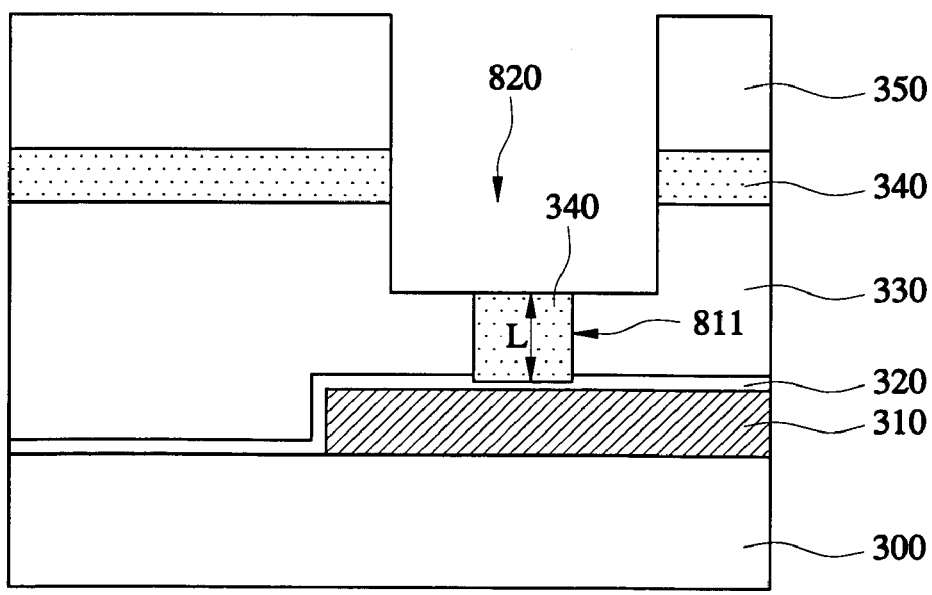

Referring to FIG. 8B, a trench 820 is formed by etching portions of the interlayer dielectric layer 330. The trench 820 is formed in the upper region U of the first preliminary via hole 811 and is connected to the lower region L of the first preliminary via hole 811. In the meantime, when the upper region U of the first preliminary via hole 811 is filled with the sacrificial layer 340, the sacrificial layer 340 of the upper region U of the first preliminary via hole 811 is also removed during a process of etching the interlayer dielectric layer 330, and the lower region L of the first preliminary via hole 811 is protected by the sacrificial layer 340 filled in the lower region L, thereby preventing any damage to the lower region L.

Figure 8C:
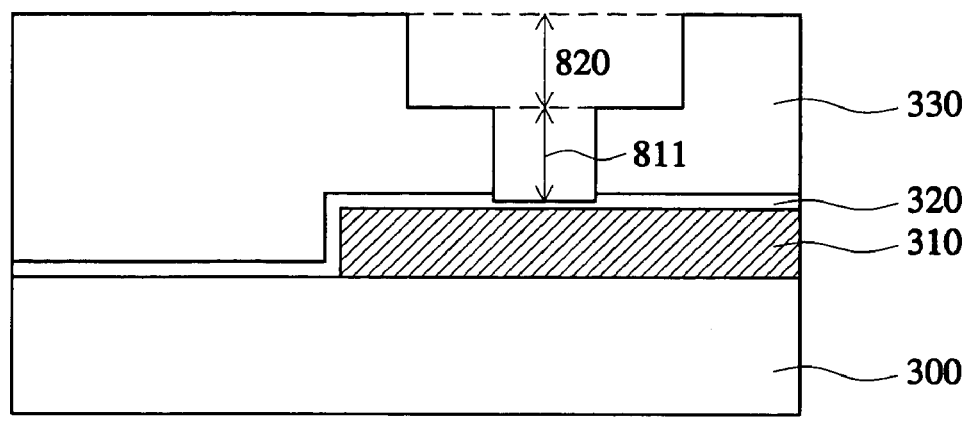
Figure 8D:
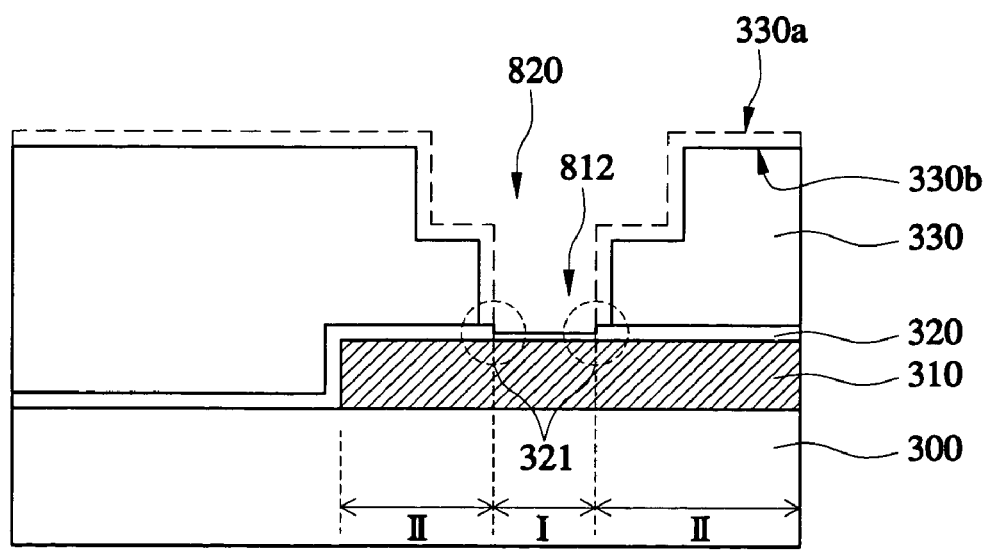

Referring to FIG. 8C, the trench etch mask 350 and the sacrificial layer 340 are removed to expose the etch-stop layer 320 at the bottom surface of the first preliminary via hole 811.

Referring to FIG. 8D, a process of expanding the preliminary via hole is performed to form a second preliminary via hole 812, which is expanded from the first preliminary via hole 811. Portions of the raised portion II of the etch-stop layer 320, which have been covered with the interlayer dielectric layer 330, are exposed at a bottom surface of the second preliminary via hole 812 in accordance with formation of the second preliminary via hole 812. The process of expanding the preliminary via hole comprises removing portions of the interlayer dielectric layer 330. Thus, the trench 820 is additionally expanded during the process of expanding the preliminary via hole. Numerical references 330a and 330b in FIG. 8D indicate both surfaces of the interlayer dielectric layer before and after expanding the preliminary via hole, respectively.

Figure 8E:
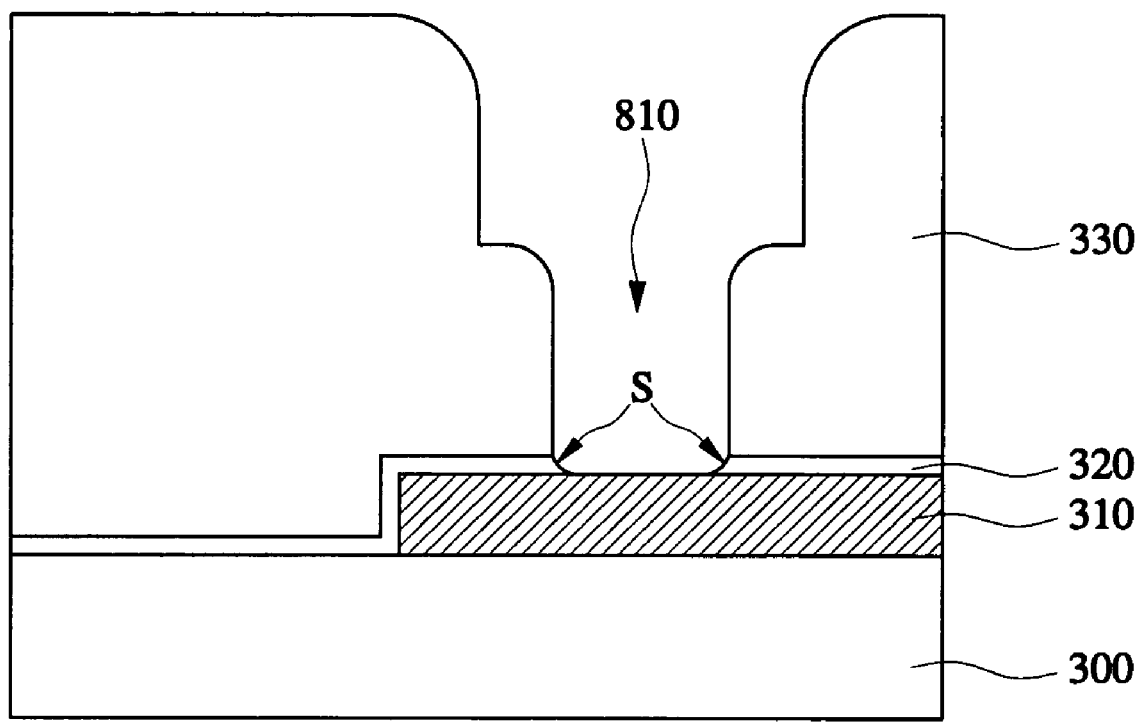

Referring to FIG. 8E, the etch-stop layer 320 at the bottom surface of the second preliminary via hole 812 is anisotropically etched, thereby forming a via hole 810. In this case, a residual of the etch-stop layer 320 having the slope S is formed at lower sides of the via hole 810 because of the difference in thickness between the exposed recessed portion I and raised portion II.

And, a subsequent process comprising steps of forming the metal diffusion barrier layer, the seed layer, the metal layer, and the like is progressed in accordance with the exemplary embodiments of FIGS. 6A-6I.

As mentioned above, in accordance with the present invention, the etch-stop layer has a slope at the bottom surface of the interconnection hole so that step coverage of the seed layer for covering the bottom surface of the interconnection hole can be enhanced. Therefore, during the process of forming the metal layer on the seed layer by using the electrochemical deposition method, the present invention prevents voids from forming within a via hole and also enhances device reliability.

While the present invention has been described with reference to exemplary embodiments, it is understood that the disclosure has been made for purpose of illustrating the invention by way of examples and is not limited to limit the scope of the invention. And one skilled in the art can amend and change the present invention without departing from the scope and spirit of the invention.

What is claimed is:

1. A method for fabricating a semiconductor device, the method comprising the steps of:
   sequentially forming an etch-stop layer end an interlayer dielectric layer on a semiconductor substrate having a lower conductive layer;
   exposing portions of the etch-stop layer by selectively etching the interlayer dielectric layer;
   forming a step in the etch-stop layer by removing portions of the exposed etch-stop layer, the step being formed at a boundary between a recessed portion of the exposed etch-stop layer and a raised portion of the etch-stop layer covered with the interlayer dielectric layer;
   exposing portions of the raised portion by removing portions of the interlayer dielectric layer; and
   forming an interconnection hole having a slope at lower sides of the interconnection hole by anisotropically etching the exposed recessed end raised portions to expose the lower conductive layer.

2. The method as claimed in claim 1, wherein the step of the etch- stop layer is formed by selectively etching the interlayer dielectric layer and exposing the portions of the etch-stop layer while performing over-etching.

3. The method as claimed in claim 1, further comprising the steps of:
   forming a seed layer for covering the lower conductive layer and the intertayer dielectric layer having the interconnection hole;
   forming a metal layer on the seed layer; and
   patterning the metal layer and the seed layer.

4. The method as claimed in claim 3, wherein the seed layer is formed by using a physical vapor deposition method.

5. The method as claimed in claim 3, further comprising the step of:
   forming a metal diffusion barrier layer for covering the exposed lower conductive layer and the interlayer dielectric layer having the interconnection hole before forming the seed layer.

6. The method as claimed in claim 3, wherein the step of patterning the metal layer and the seed layer includes polishing the metal layer and the seed layer until the interlayer dielectric layer is exposed.

7. The method as claimed in claim 5, wherein the metal diffusion barrier layer is formed by using a physical vapor deposition method.

8. The method as claimed in claim 1, wherein the etch-stop layer is a material selected from the group consisting of SIN, SiC, and BCB (BenzoCycloButene) organic insulating layer.

9. The method as claimed in claim 8, wherein the interlayer dielectric layer is a material selected from the group consisting of FSG (fluorinated silicate glass), SiOC, and organic or inorganic SOD (spin on dielectric).

10. The method as claimed in claim 9, wherein the intedayer dielectiic layer is removed by dry etching using plasma to expose the portions of the raised portion.

11. The method as claimed in claim 9, wherein the interlayer dielectric layer is removed by wet etching using an HF solution to expose the portions of the raised portion.

12. The method as claimed in claim 1, further comprising the step of:
   forming a trench by selectively etching the interlayer dielectric layer, before exposing the portions of the etch-slop layer,
   wherein the step of exposing the portions of the etch-stop layer includes removing portions of the interlayer dielectric layer where the trench is formed.

13. The method as claimed in claim 12, further comprising the steps of:
   forming a seed tayer for covering the lower conductive layer and the interlayer dielectric layer having the trench and the interconnection hole;
   forming a metal layer on the seed layer by using an electrochemical deposition method; and
   patterning the metal layer and the seed layer.

14. The method as claimed in claim 13, further comprising the step of:
   forming a metal diffusion barrier layer for covering the exposed lower conductive layer and the interlayer dielectric layer having the interconnection hole before forming the seed layer.

15. The method as claimed in claim 14, wherein the metal diffusion barrier layer and the seed layer are formed by using a physical vapor deposition method.

* * * * *